(12) United States Patent
Sato et al.

(10) Patent No.: US 11,935,824 B2
(45) Date of Patent: Mar. 19, 2024

(54) INTEGRATED CIRCUIT PACKAGE MODULE INCLUDING A BONDING SYSTEM

(71) Applicant: Microchip Technology Incorporated, Chandler, AZ (US)

(72) Inventors: Justin Sato, West Linn, OR (US); Bomy Chen, Newark, CA (US); Yaojian Leng, Vancouver, WA (US); Julius Kovats, Manitou Springs, CO (US)

(73) Assignee: Microchip Technology Incorporated, Chandler, AZ (US)

( * ) Notice: Subject to any disclaimer, the term of this patent is extended or adjusted under 35 U.S.C. 154(b) by 265 days.

(21) Appl. No.: 17/665,749

(22) Filed: Feb. 7, 2022

(65) Prior Publication Data

US 2023/0099856 A1 Mar. 30, 2023

Related U.S. Application Data

(60) Provisional application No. 63/249,854, filed on Sep. 29, 2021.

(51) Int. Cl.
| | |
|---|---|
| *H01L 23/48* | (2006.01) |
| *H01L 23/498* | (2006.01) |
| *H01L 23/50* | (2006.01) |
| *H01L 25/065* | (2023.01) |

(52) U.S. Cl.
CPC .. *H01L 23/49838* (2013.01); *H01L 23/49827* (2013.01); *H01L 23/49866* (2013.01); *H01L 23/50* (2013.01); *H01L 25/0652* (2013.01)

(58) Field of Classification Search
CPC ............... H01L 25/0652; H01L 23/50; H01L 23/49866; H01L 23/49827; H01L 23/49838
See application file for complete search history.

(56) References Cited

U.S. PATENT DOCUMENTS

| | | | |
|---|---|---|---|
| 2019/0214367 A1* | 7/2019 | Chen | ..................... H01L 23/552 |
| 2019/0319007 A1 | 10/2019 | Uzoh et al. | |
| 2020/0135690 A1 | 4/2020 | Lianto et al. | |

(Continued)

OTHER PUBLICATIONS

Vogt, M. et al., "Dielectric barriers for Cu Metallization Systems," Microelectronic Engineering, vol. 37-38, pp. 181-187, Nov. 1, 1997.

(Continued)

*Primary Examiner* — Hoa B Trinh
(74) *Attorney, Agent, or Firm* — Slayden Grubert Beard PLLC

(57) ABSTRACT

An integrated circuit package module includes an integrated circuit package device including a contact element, and a bonding system formed on the integrated circuit package device. The bonding system includes a bonding system substrate and a bonding element formed in the bonding system substrate and conductively coupled to the contact element of the integrated circuit package device. The bonding element includes (a) a conduction component conductively connected to the contact element, the conduction component formed from a first metal having a first melting point, and (b) a bonding component formed from a second metal having a second melting point lower than the first melting point of the first metal.

26 Claims, 17 Drawing Sheets

(56) References Cited

U.S. PATENT DOCUMENTS

2020/0411469 A1 12/2020 Yu et al.
2021/0398923 A1* 12/2021 Kang .................... H01L 23/552

OTHER PUBLICATIONS

Lai, Jian-Lun et al., " Using an SU-8 Photoresist Structure and Cytochrome C Thin Film Sensing Material for a Microbolometer," Sensors, vol. 12, pp. 16390-16403, Nov. 27, 2012.
Ohara, Yuki, "A Cost Effective via Last TSV Technology Using Molten Solder Filling for Automobile Application," 2017 IEEE 67th Electronic Components and Technology Conference (ECTC), pp. 47-52, May 30, 2017.
International Search Report and Written Opinion, Application No. PCT/US2022/022355, 18 pages, dated Aug. 11, 2022.

* cited by examiner

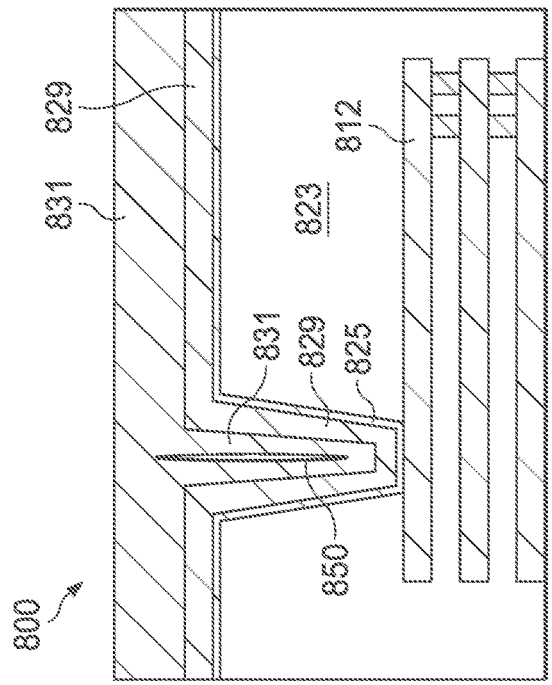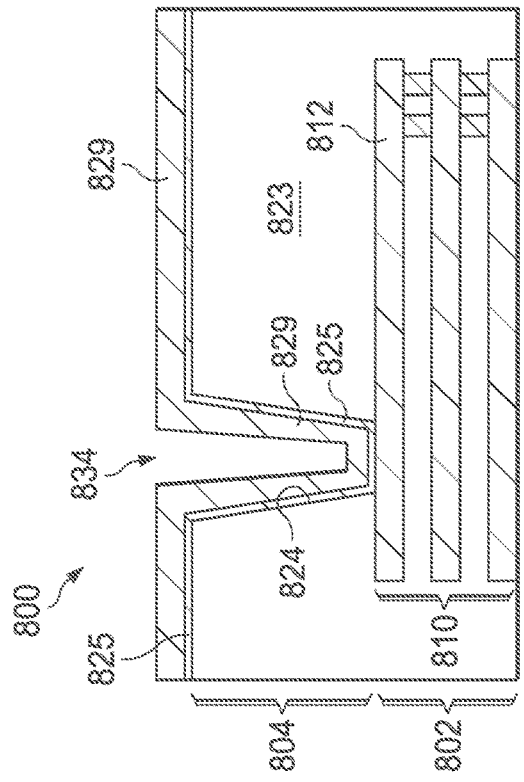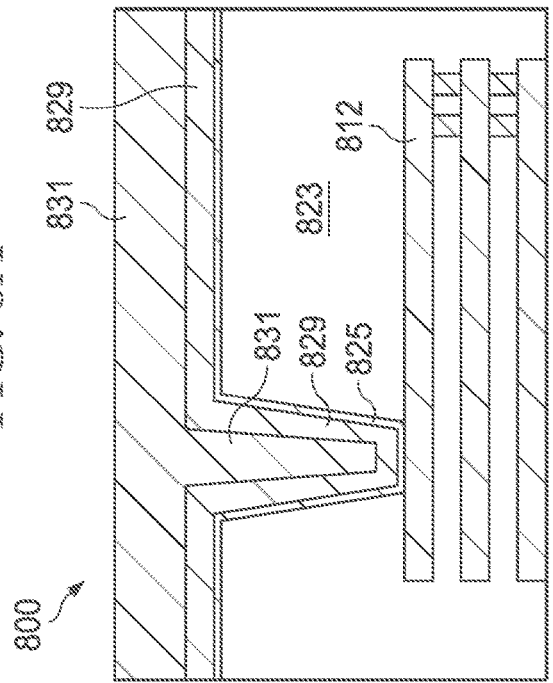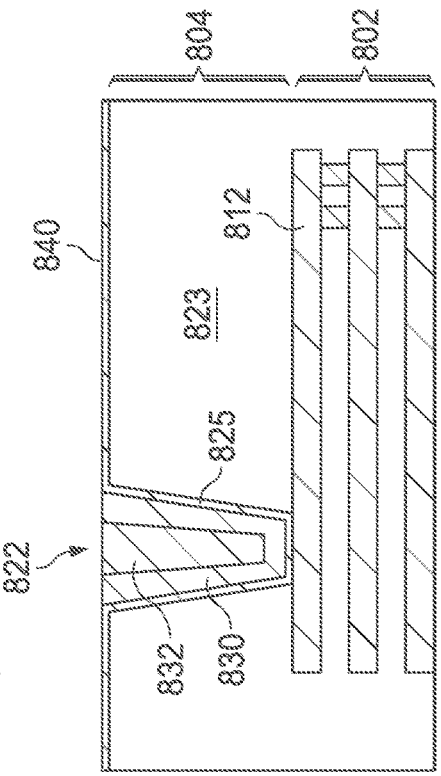
FIG. 8A
FIG. 8B
FIG. 8C
FIG. 8D

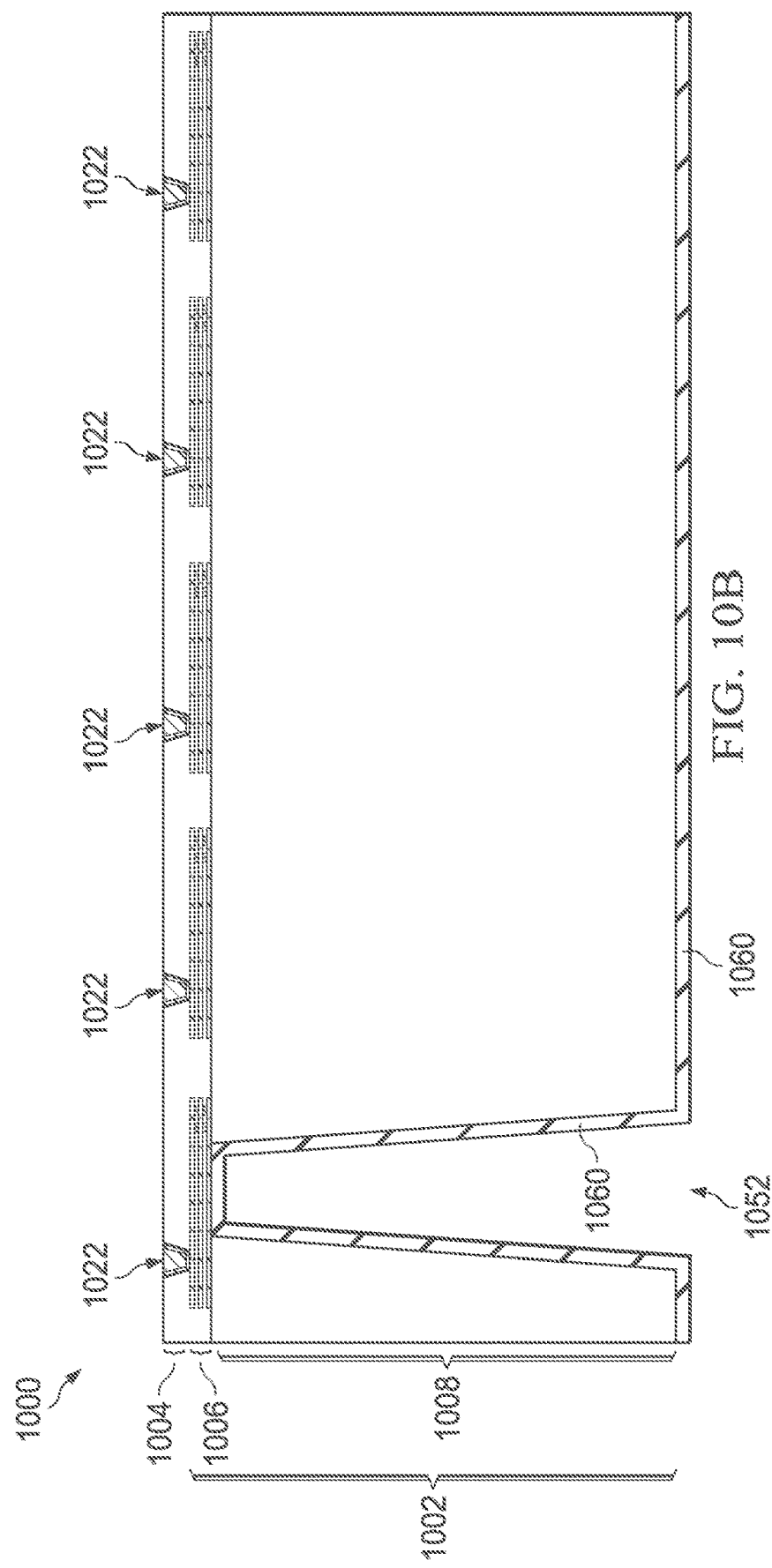

INTEGRATED CIRCUIT PACKAGE MODULE INCLUDING A BONDING SYSTEM

RELATED PATENT APPLICATION

This application claims priority to commonly owned U.S. Provisional Patent Application No. 63/249,854 filed Sep. 29, 2021, the entire contents of which are hereby incorporated by reference for all purposes.

TECHNICAL FIELD

The present disclosure relates to integrated circuit (IC) packages, and more particularly to an IC package module including a bonding system including a bonding element with a conduction component and a bonding component.

BACKGROUND

An integrated circuit (IC) package includes various elements assembled together in a package suitable for handling or mounting on a printed circuit board (PCB) or other support structure. The elements of an IC package are referred to herein as "integrated circuit package devices" or "IC package devices." Some example types of IC package devices include IC dies (also referred to as chips), passive interposers (interposers including passive electrical routing elements, resistors, capacitors, and inductors), active interposers (interposers including electrical routing elements as well as active circuit elements, e.g., transistors, voltage regulators, or input/output controllers, without limitation).

IC package devices may be arranged and packaged in various manners to form various different types of IC packages, including DIP (Double In-line Package), SOP/SOIC/SO (Small Outline Package), QFP (Quad Flat Package), QFN/LCC (Quad Flat Non-leaded Package), BGA (Ball Grid Array Package), CSP (Chip Scale Package), and SiP (System-in-Package), among many others.

In some types of IC packages, two or more IC package devices are bonded to each other to provide electrical connections between the IC package devices. For example, in some SiP packages, two or more dies (chips) may be directly bonded to each other to provide direct electrical connections between bond pads (e.g., copper pads) or other conductive contacts on the respective dies, thereby defining communication pathways between the dies. However, forming effective direct bonds between the bond pads or contacts of the different dies is often technically difficult and expensive.

There is a need for reliable and cost-effective structures and methods for bonding IC package devices to each other in an IC package.

SUMMARY

An IC package module includes an IC package device and a bonding system for bonding the IC package device to other IC package devices. The bonding system includes at least one bonding element array, each including one or more bonding element. Each bonding element may include a conduction component for providing a conductive connection with a complementary device (e.g., an IC die, interposer, or other IC package module) and a bonding component for forming a physical bond with the complementary device.

In some examples, each bonding element includes at least two different metal components, including a conduction component formed from a first metal primarily provided for electrical conduction and a bonding component formed from a second metal provided for bond formation with an opposing device, in addition to electrical conduction. Such bonding element including both a conduction component and a bonding component may provide effective and reliable physical and electrical connections with an opposing device.

In some examples, the bonding component provides a solder connection with an opposing device and may bond at lower temperatures (e.g., in a temperature range of 180-300 C, or 200-250 C) than direct metal bonding (e.g., above 300 C).

One aspect provides an integrated circuit package module including an integrated circuit package device including a contact element and a bonding system formed on the integrated circuit package device. The bonding system includes a bonding system substrate and a bonding element formed in the bonding system substrate and conductively coupled to the contact element of the integrated circuit package device. The bonding element includes a conduction component conductively connected to the contact element, the conduction component formed from a first metal having a first melting point, and a bonding component formed from a second metal having a second melting point lower than the first melting point of the first metal.

In some examples, the first metal comprises copper, silver, or gold, and the second metal comprises tin, indium, a tin alloy, or an indium alloy.

In some examples, the bonding system substrate comprises a passivation region.

In some examples, the bonding component is formed in a conduction component opening defined by the conduction component.

In some examples, an exposed surface of the bonding system opposite the integrated circuit package device includes an exposed surface of the conduction component and an exposed surface of the bonding component.

In some examples, the bonding element is formed in a via opening.

In some examples, the integrated circuit package device comprises an interposer.

In some examples, the integrated circuit package device comprises an integrated circuit die.

In some examples, the conduction component extends fully through a thickness of the bonding system substrate, and the bonding component extends only partially through the thickness of the bonding system substrate.

In some examples, the bonding system includes multiple bonding elements formed in the bonding system substrate and conductively coupled to the contact element. Each bonding element of the multiple bonding elements includes a respective conduction component conductively connected to the contact element and formed from the first metal, and a respective bonding component formed from the second metal.

Another aspect provides an integrated circuit package including a first integrated circuit package module and a second integrated circuit package module. The first integrated circuit package module includes a first integrated circuit package device including a first contact element, and a bonding system formed on the integrated circuit package device. The bonding system includes a bonding system substrate and a bonding element formed in the bonding system substrate. The bonding element includes a conduction component conductively connected to the first contact element, the conduction component formed from a first metal having a first melting point, and a bonding component formed from a second metal having a second melting point lower than the first melting point of the first metal. The second integrated circuit package module is bonded to the bonding system of the first integrated circuit package module such that the bonding system of the first integrated circuit package module is arranged between the second integrated circuit package module and the first integrated circuit package device of the first integrated circuit package module. The bonding component of the bonding element forms a bond with a second contact element of the second integrated circuit package module. The bonding element provides a conductive connection between the first contact element of the first integrated circuit package module and the second contact element of the second integrated circuit package module.

In some examples, the first integrated circuit package device comprises an interposer.

In some examples, the first integrated circuit package device comprises an integrated circuit die.

In some examples, the first metal comprises copper, silver, or gold, and the second metal comprises tin, indium, a tin alloy, or an indium alloy.

In some examples, the bonding component is formed in a conduction component opening defined by the conduction component.

In some examples, the bond between the bonding element and the second contact element of the second integrated circuit package module includes a bond between the bonding component of the bonding element and second contact element of the second integrated circuit package module.

In some examples, the electrical connection between the bonding element and the second contact element of the second integrated circuit package module includes a conductive connection between the conduction component of the bonding element and second contact element of the second integrated circuit package module.

In some examples, the electrical connection between the bonding element and the second contact element of the second integrated circuit package module includes a conductive connection between the conduction component of the bonding element and second contact element of the second integrated circuit package module via the bonding component of the bonding element.

Another aspect provides an integrated circuit package including a first integrated circuit package module and a second integrated circuit package module. The first integrated circuit package module includes a first integrated circuit package device including a first contact element, and a first bonding system formed on the first integrated circuit package device. The first bonding system includes a first bonding system substrate, a first bonding element formed in the first bonding system substrate. The first bonding element includes a first conduction component conductively connected to the first contact element, and a first bonding component formed from a first bonding component metal having a melting point lower than a melting point of a first conduction component metal. The second integrated circuit package module includes a second integrated circuit package device including a second contact element, and a second bonding system formed on the second integrated circuit package device. The second integrated circuit package device includes a second bonding system substrate and a second bonding element formed in the second bonding system substrate. The second bonding element includes a second conduction component conductively connected to the second contact element, and a second bonding component formed from a second bonding component metal having a melting point lower than a melting point of a second conduction component metal. The first bonding component of the first bonding element is bonded to the second bonding component of the second bonding element to form a bond between the first bonding system and the second bonding system. The first conduction component of the first bonding element is conductively connected to the second conduction component of the second bonding element to define a conductive connection between the first contact element of the first integrated circuit package device and the second contact element of the second integrated circuit package device.

In some examples, at least one of the first integrated circuit package device and second integrated circuit package device comprises an interposer.

In some examples, at least one of the first integrated circuit package device and second integrated circuit package device comprises an integrated circuit die.

In some examples, each of the first conduction component metal and the second conduction component metal comprises copper, silver, or gold, and each of the first bonding component metal and the second bonding component metal comprises tin, indium, a tin alloy, or an indium alloy.

In some examples, the first bonding component is formed in a conduction component opening defined in the first conduction component, and the second bonding component is formed in a conduction component opening defined in the second conduction component.

In some examples, the first conduction component extends fully through a thickness of the first bonding system substrate, the first bonding component extends only partially through the thickness of the first bonding system substrate, the second conduction component extends fully through a thickness of the second bonding system substrate, and the second bonding component extends only partially through the thickness of the second bonding system substrate.

BRIEF DESCRIPTION OF THE DRAWINGS

Example aspects of the present disclosure are described below in conjunction with the figures, in which:

FIGS. 8A-8D are side cross-sectional views of an IC package module showing an example process for forming a bonding element;

FIGS. 10A-10F are side cross-sectional views of an IC package module showing an example process for forming a bonding through-via of a back-side bonding system for the IC package module.

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

The present disclosure provides an IC package module including an IC package device and a bonding system for bonding the IC package device to other devices in an IC package. The bonding system may include at least one bonding element array, each including at least one multi-component bonding element including a conduction component and a bonding component. IC packages including at least one IC package module are also provided, along with methods for forming IC package modules including such bonding systems.

Figure 1A:
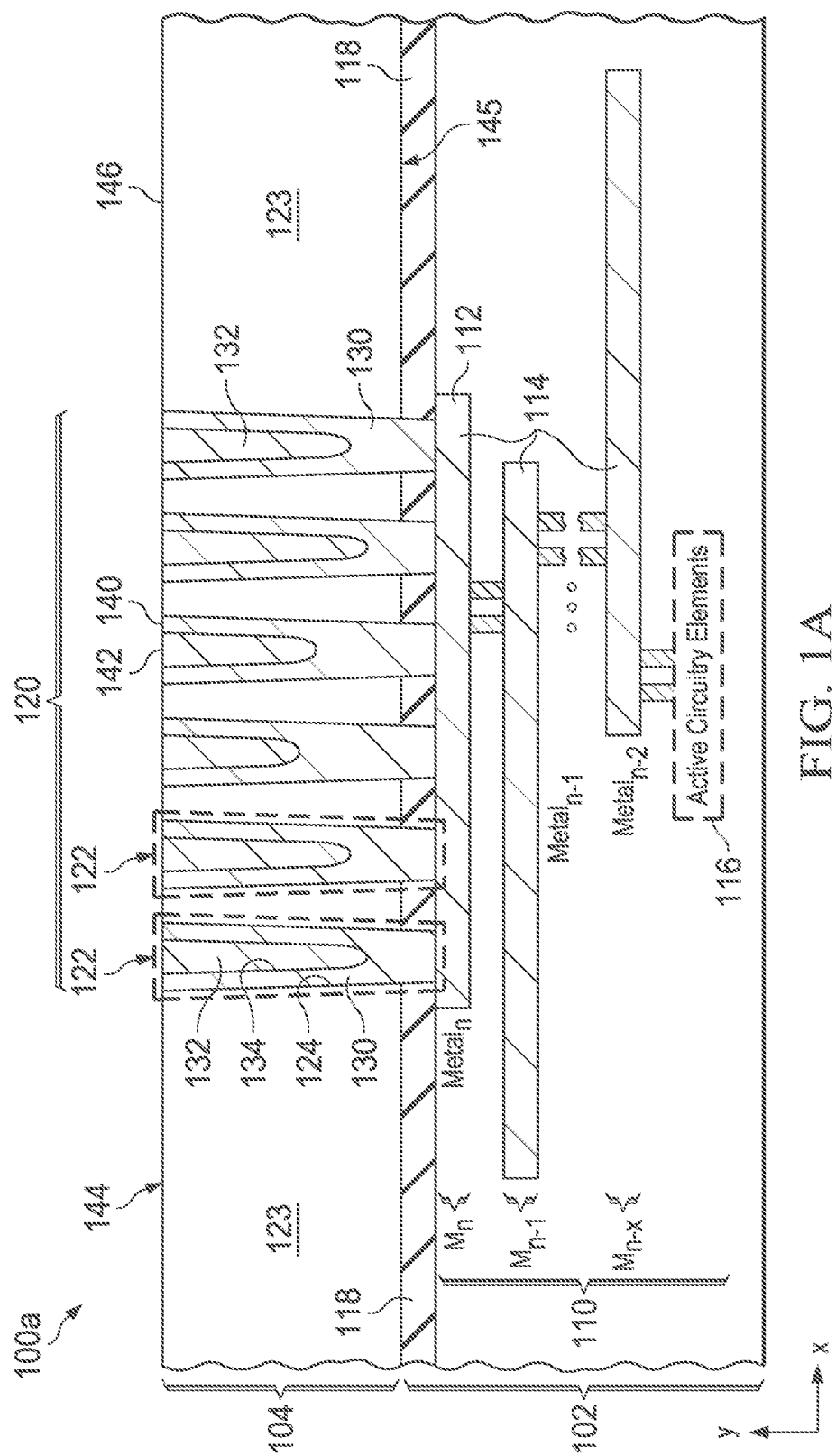
FIG. 1A shows a portion of an example IC package module including an IC package device and a bonding system for bonding the IC package module device to at least one complementary device.

FIG. 1A shows a portion of an example integrated circuit (IC) package module 100a including an IC package device 102 and a bonding system 104 for bonding the IC package module 100a to at least one other IC package device or structure in an IC package, referred to herein as "complementary devices." IC package device 102 may comprise, for example, an IC die (chip), a passive interposer, an active interposer, or other designed or suitable substrate for assembling with at least one complementary device in an IC package. A complementary device that may be bonded to the IC package device 102 by the bonding system 104 may include, for example, an IC die (chip), interposer (passive interposer or active interposer), or another IC package module including a bonding system similar to bonding system 104, e.g., as discussed below with respect to FIG. 2.

IC package device 102 may comprise circuitry 110, which may include (a) passive circuitry elements 114, e.g., conductive elements for routing electrical signals, resistors, capacitors, inductors, or any other type of passive circuit element, and optionally (b) active circuitry elements 116, e.g., transistors, voltage regulators, input/output controllers, or any other type of active circuit element. Circuitry 110 may include at least one contact element 112. In some examples, e.g., where IC package device 102 comprises an IC die (chip) or an active interposer, circuitry 110 may include both passive circuitry elements 114 and active circuitry elements 116. In other examples, e.g., where IC package device 102 comprises a passive interposer, circuitry 110 may include passive circuitry elements 114 (e.g., passive elements for routing electrical signals) but omit any active circuitry elements 116. Thus, active circuitry elements 116 are optional depending on the particular example, and thus illustrated in FIG. 1A with a dashed line. In the example shown in FIG. 1A, circuitry 110 includes passive circuitry elements 114 defined by metal interconnect layers $M_n$ (top metal layer), $M_{n-1}, \ldots M_{n-x}$, and optionally includes active circuitry elements 116 connected to the passive circuitry elements 114.

Figure 2:
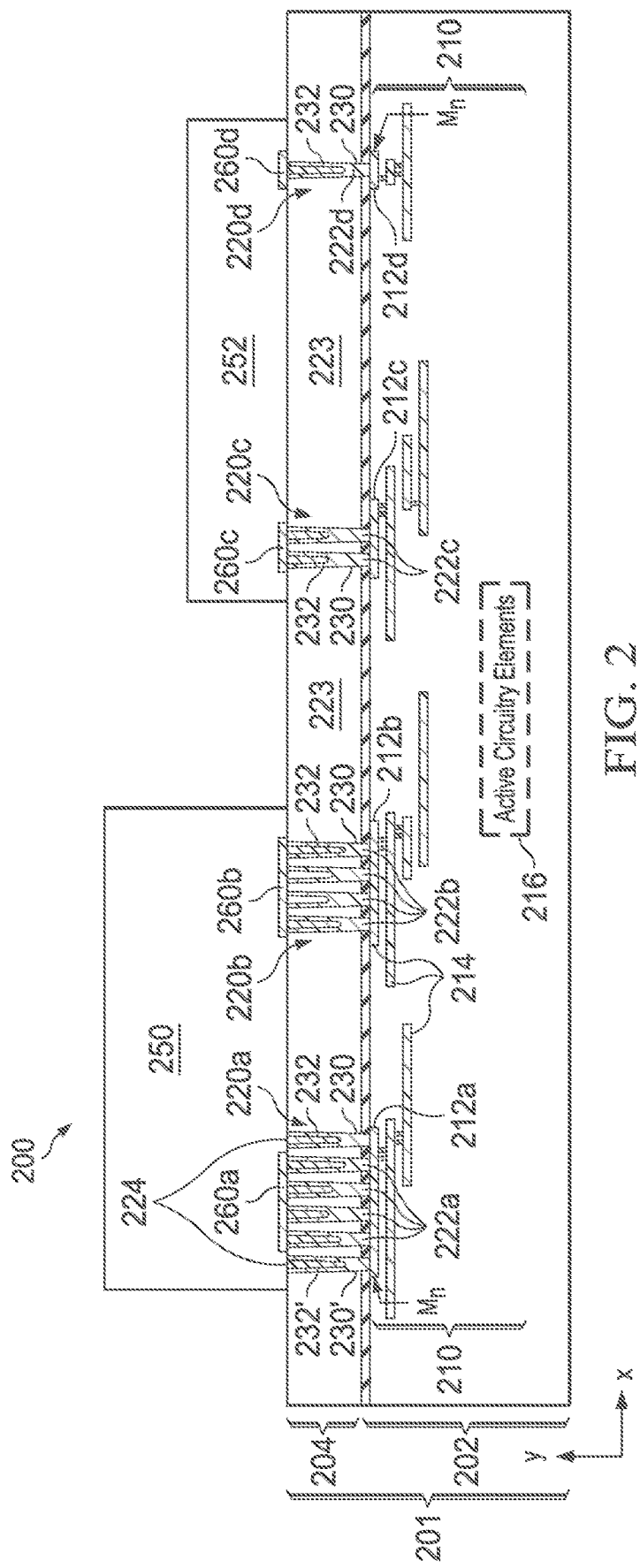
FIG. 2 shows an example IC package including an IC package module bonded to two complementary devices.
Figure 3A:
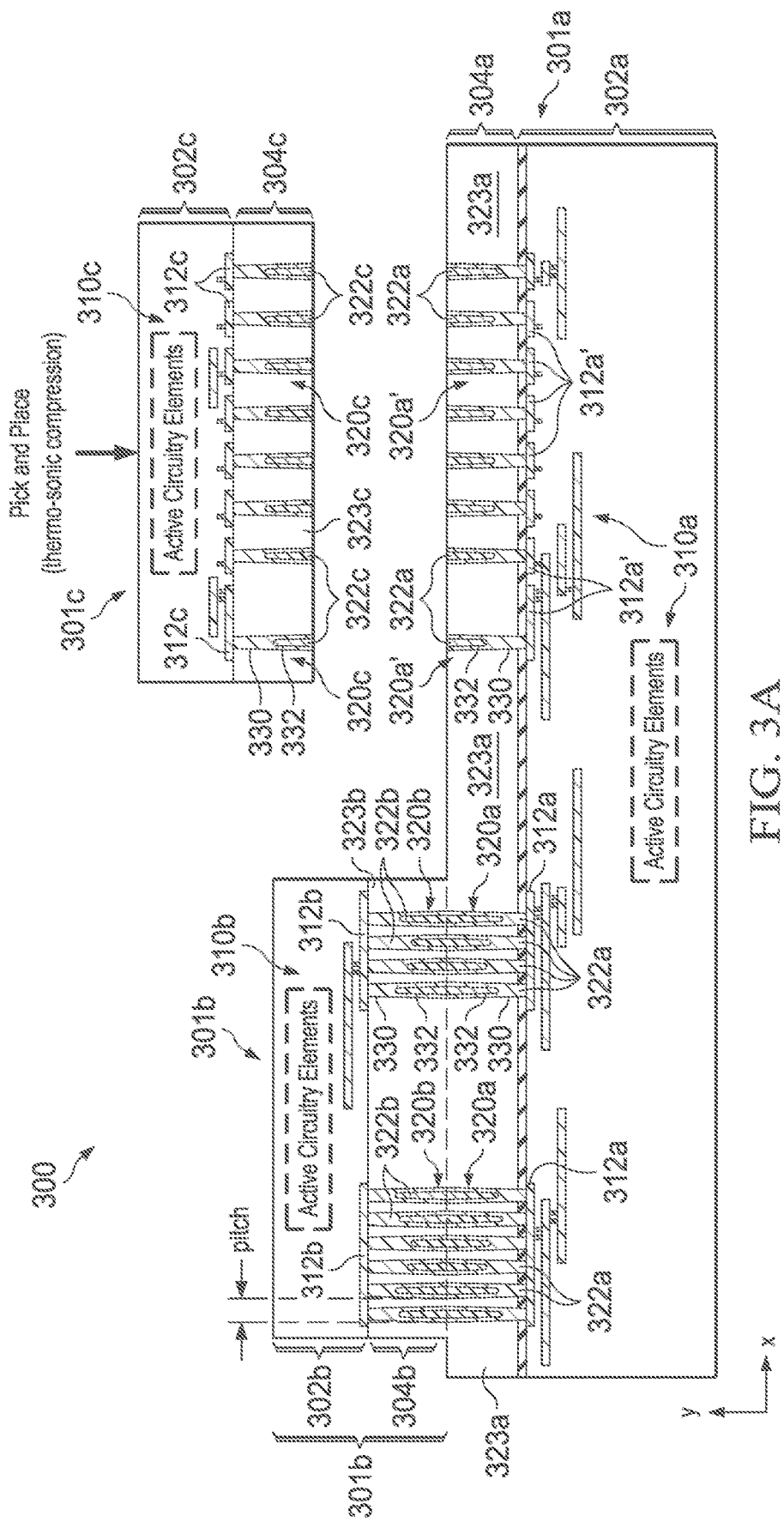
FIGS. 3A and 3B show an example IC package including three IC package modules.
Figure 3B:
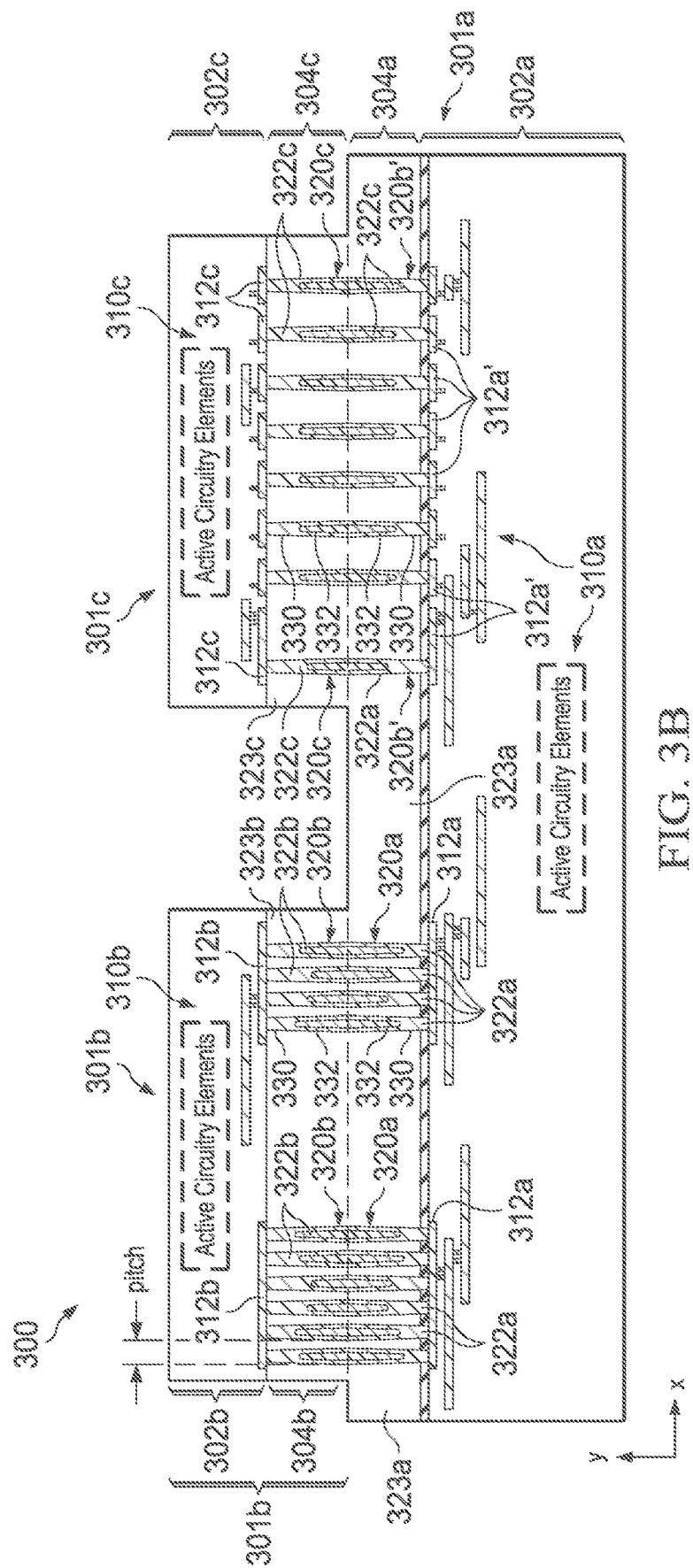

Circuitry 110 may include at least one contact element 112 for providing electrical connection(s) with corresponding circuitry of at least one complementary device bonded to the IC package module 100a, e.g., as shown in FIGS. 2 and 3A-3B discussed below. In some examples, each contact element 112 may comprise a bond pad or other conductive pad, a pin, a structure formed in a top metal layer, or other conductive element. In the example shown in FIG. 1A, circuitry 110 includes a contact element 112 formed in the top metal interconnect layer $M_n$.

In some examples, IC package device 102 may include a barrier layer 118 formed over the contact element(s) 112, e.g., to protect the contact element 112 from corrosion, diffusion, or other degradation. In the illustrated example, barrier layer 118 may comprise a dielectric barrier layer, e.g., comprising silicon carbide (SiC) or silicon nitride (SiN), formed over the top metal interconnect layer $M_n$ including contact element 112.

Bonding system 104 formed on the IC package device 102 includes at least one bonding element array 120 formed in a bonding system substrate 123 and conductively coupled to at least one contact element 112. In some examples, bonding system substrate 123 may include a passivation region formed on the barrier layer 118 of the IC package device 102. For example, bonding system substrate 123 may comprise a silicon oxynitride (SiON) passivation region.

Bonding system 104 may include any number of bonding element arrays 120, each including any number of respective bonding elements 122 extending from a top side 144 of the bonding system substrate 123 opposite the IP package device 102 to (and/or beyond) a bottom side 145 of the bonding system substrate 123 facing the IP package device 102. Each bonding element array 120 may include an array of one or multiple bonding elements 122 conductively coupled to a respective contact element 112 to provide electrical connection to the respective contact element 112. In some examples, bonding system 104 may include multiple bonding element arrays 120 arranged to contact multiple corresponding contact elements 112 of one or more complementary devices, which may allow direct bonding of multiple IC packages devices with increased pin counts and/or disaggregated parts (e.g., different parts of a die), e.g., as compared with conventional practices for bonding IC package elements. In addition, in some examples providing multiple bonding elements 122 in each bonding element array 120 (in this illustrated example, six bonding elements 122) may provide multiple redundant electrical connections to each respective contact element 112.

The illustrated portion of the IC package module 100a shown in FIG. 1A shows a single bonding element array 120 including six bonding elements 122 conductively coupled to a single contact element 112. Each bonding element 122 extends through a respective bonding element opening 124 formed in the bonding system substrate 123. Each bonding element opening 124 may comprise a via opening, a trench opening, or other suitable opening. Thus, each bonding element 122 may be formed with a via-type structure, a trench-type structure, or other suitable structure, depending on the shape and size of the respective bonding element opening 124.

Each bonding element 122 may include at least two components formed from at least two different metallic compounds, including a conduction component 130 and a bonding component 132. Bonding elements 122 including both a respective bonding component 132 and a respective conduction component 130 may provide improved physical connection and/or electrical connection, as compared with certain conventional bonding systems. As discussed below in more detail, in some examples the bonding elements 122 provide a bond similar to a soldered-connection and may allow a bonding process at a lower temperature (e.g., in a range of 180° C.-300° C., or in a range of 200° C.-250° C.) than a conventional direct metal bonding process (e.g., performed above 300° C.).

In the example shown in FIG. 1A, each bonding element 122 includes (a) a conduction component 130, formed in a respective bonding element opening 124, conductively connected to the contact element 112, and (b) a bonding component 132 formed in a conduction component opening 134 defined by the conduction component 130. When the IC package module 100a is bonded to a complementary device (e.g., die, interposer, or IC package module having a bonding system similar to bonding system 104), the bonding component 132 of each bonding element 122 forms a physical bond (e.g., a solder-type bond) with a corresponding opposing structure of the complementary device, and in some arrangements the conduction component 130 may also form a physical bond with a corresponding opposing structure of the complementary device. The conduction component 130 and bonding component 132 of each bonding element 122 may cooperate to provide a conductive connection between the contact element 112 and an opposing contact element of the complementary device. Thus, although the conduction component 130 and the bonding component 132 may both contribute to forming a physical bond and forming an electrical connection with the complementary device, in some examples the conduction component 130 is primarily provided for its conductive functionality while the bonding component 132 is primary provided for its bonding functionality.

In some examples, the conduction component 130 may be formed from a first metal having a first melting point, while the bonding component 132 may be formed from a second metal having a second melting point lower than the first melting point of the first metal. For example, the first metal forming the conduction component 130 may comprise copper (Cu), silver (Ag), or gold (Au), while the second metal forming the bonding component 132 may comprise tin (Sn), indium (In), a tin alloy (e.g., tin alloyed with silver, indium, or other suitable metal), or an indium alloy (e.g., alloyed with silver, tin, or other suitable metal).

The first melting point of the first metal forming each conduction component 130 and the second melting point of the second metal forming each bonding component 132) may be utilized to perform a heated bonding process to bond the IC package module 100a to a complementary device. For example, the IC package module 100a and the complementary device may be bonded together in a heated compression bonding process in which the bonding elements 122 are heated to melt or soften the second metal of the bonding components 132 without melting or softening the first metal of the conduction components 130, such that the melted or softened bonding components 132 are deformed to form a solder bond with opposing structures of the complementary device, while the conduction components 130 maintain their structural form. For example, as noted above, a bonding process may be performed in a temperature range of 180° C.-300° C., or in a range of 200° C.-250° C.

As shown in FIG. 1A, each bonding element 122 extends in the y-direction from the top side 144 of the bonding system substrate 123 through a full thickness (depth) of the bonding system substrate 123 and into contact with the contact element 112. In particular, each conduction component 130 extends in the y-direction from an exposed top surface 140 at a top side 144 of the bonding system substrate 123 through a full thickness (depth) of the bonding system substrate 123, and further through a respective opening in the barrier layer 118, to contact an exposed surface of the contact element 112. In contrast, each bonding component 132 formed in a respective conduction component 130 extends in the y-direction from a top exposed surface 142 at the top side 144 of the bonding system substrate 123 through a partial (not full) thickness (depth) of the respective conduction component 130, e.g., through a partial (not full) thickness (depth) of the bonding system substrate 123. As discussed below with reference to FIG. 7B, different conduction component openings 134 may have different depths (in the y-direction) resulting from the deposition process for depositing the first metal forming the different conduction components 130. Thus, as shown in the example of FIG. 1A, each bonding component 132 may extend down (in the y-direction) to a different depth as a function of the depth of the respective conduction component opening 134 in the respective conduction component 130. In addition, as shown in FIG. 1A, an exposed surface 146 at the top side 144 of the bonding system 104 opposite the IP package device 102 includes the top exposed surface 140 of each conduction component 140 and the top exposed surface 142 of each bonding component 132.

Figure 1B:
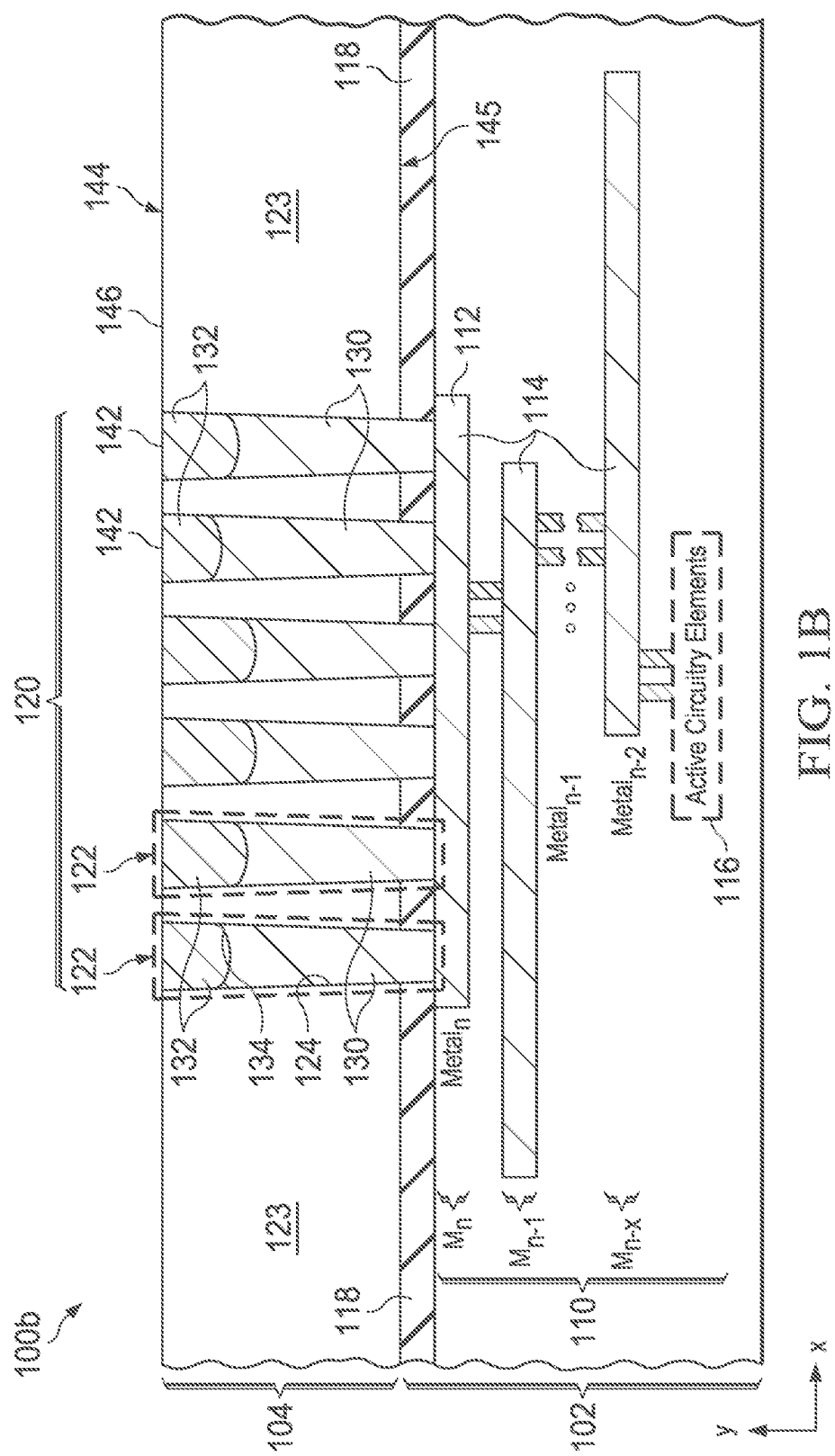
FIG. 1B shows a portion of another example IC package module including an IC package device and another bonding system for bonding the IC package module device to at least one complementary device.

FIG. 1B shows a portion of another example IC package module 100b including an IC package device 102 and a bonding system 104 for bonding the IC package module 100a to at least one other complementary device. IC package module 100b is similar to IC package module 100a shown in FIG. 1A, except the shape of the conduction components 130 and bonding components 132 of bonding elements 122. In particular, whereas the conduction components 130 of IC package module 100a shown in FIG. 1A extended to the exposed surface 146 at the top side 144 of the bonding system 104, the conduction components 130 of IC package module 100b shown in FIG. 1B do not extend to the exposed surface 146. Rather, the conduction components 130 of IC package module 100b are fully covered by the respective bonding components 132. As with bonding elements 122 of IC package module 100a, the conduction components 130 and bonding components 132 of the bonding elements 122 of IC package module 100b cooperate to define an electrical connection between contact element 112 and the relevant complementary device.

FIG. 2 shows an example IC package 200 including an IC package module 201 bonded to a first example complementary device 250 and a second example complementary device 252. Similar to the IC package module 100a shown in FIGS. 1A and 1B, the IC package module 201 includes an IC package device 202 and a bonding system 204 for bonding the integrated circuit package module 201 to each of complementary device 250 and 252. IC package device 202 may comprise, for example, an IC die (chip), a passive interposer, an active interposer, or other device designed or suitable for assembling with complementary devices 250 and 252 in the IC package 200. Each complementary device 250 and 252 may comprise, for example, an IC die (chip) or an interposer (e.g., a passive interposer or active interposer).

IC package device 202 includes circuitry 210 including passive circuit elements 214 defined in metal interconnect and (optionally) active circuitry elements 216. Passive circuit elements 214 include four example contact elements 212a-212d formed in a top metal interconnect layer $M_n$, and arranged for electrical connection with corresponding contact elements 260a and 260b provided in complementary device 250 and contact elements 260c and 260d provided in complementary device 252.

Bonding system 204 may be formed on the IC package device 202, e.g., on a barrier layer 218 formed on a top side of the IC package device 202. Bonding system 204 may include four bonding element arrays 220a-220d for providing electrical connections between contact elements 212a-212d and contact elements 260a-260d, respectively.

Bonding element array 220a includes an array of bonding elements 222a providing electrical connection between contact element 212a of IC package device 202 and contact element 260a of complementary device 250. Each bonding element 222a may be formed as a via-type or trench-type structure in a respective via or trench opening in a bonding system substrate 223, e.g., silicon oxynitride (SiON) passivation region. Similar to bonding elements 122 discussed above regarding FIGS. 1A and 1B, each bonding element 222a of bonding element array 220a may include a conduction component 230 and a bonding component 232 formed in a conduction component opening defined by the conduction component 230. Conduction components 230 and bonding components 232 may be similar to conduction components 130 and bonding components 132 shown in FIG. 1A or FIG. 1B. When complementary device 250 is bonded to IC package module 201 as shown in FIG. 2 (e.g., using heating, compression, ultrasonic, and/or other bonding processes), the bonding component 232 (and/or conduction component 230) of each bonding element 222a forms a physical bond with contact element 260a of complementary device 250, and the conduction component 230 and bonding component 232 of each bonding element 222a collectively define a conductive connection between contact element 212a of IC package device 202 and contact element 260a of complementary device 250. The multiple bonding elements 222a may provide redundant physical bonds and redundant electrical connections between contact element 212a and contact element 260a.

Bonding element array 220a also includes a guard ring 224 formed as a ring-shaped element in a ring-shaped trench extending around the array of bonding elements 222a. Guard ring 224 may prevent or reduce metal diffusion from contact element 260a of complementary device 250. Guard ring 224 may include a conduction component 230' and a bonding component 232' formed in a conduction component opening defined by the conduction component 230'. The conduction component 230' and bonding component 232' may be formed concurrently with, and from the same materials, as conduction components 230 and bonding components 232, respectively. As shown in FIG. 2, guard ring 224 may not contact the contact element 260a of complementary device 250, but may form a bond with a surface of complementary device 250 apart from contact element 260a.

Bonding element array 220b includes an array of bonding elements 222b providing electrical connection between contact element 212b of IC package device 202 and contact element 260b of complementary device 250. Unlike bonding element array 220a discussed above, bonding element array 220b does not include a guard ring 224. Each bonding element 222b may be formed as a via-type or trench-type structure in a respective via or trench opening in the bonding system substrate 223. Similar to bonding elements 222a, each bonding element 222b of bonding element array 220b may include a conduction component 230 conductively connected to contact element 212b, and a bonding component 232 formed in a conduction component opening defined by the conduction component 230. When complementary device 250 is bonded to IC package module 201 as shown in FIG. 2 (e.g., using heating, compression, ultrasonic, and/or other bonding processes), the bonding component 232 of each bonding element 222b forms a physical bond with contact element 260b of complementary device 250, and the conduction component 230 and bonding component 232 collectively define a conductive connection between contact element 212b of IC package device 202 and contact element 260b of complementary device 250. The multiple bonding elements 222b may provide redundant physical bonds and redundant electrical connections between contact element 212b and contact element 260b.

Bonding element array 220c includes an array of bonding elements 222c providing electrical connection between contact element 212c of IC package device 202 and contact element 260c of complementary device 252. Bonding element array 220c may include a two-dimensional array of bonding elements 222c, for example a 2×2 array or 2×3 array of bonding elements 222c. Each bonding element 222c may be formed as a via-type or trench-type structure in a respective via or trench opening in the bonding system substrate 223. Similar to bonding elements 222a and 222b, each bonding element 222c may include a conduction component 230 conductively connected to contact element 212c, and a bonding component 232 formed in a conduction component opening defined by the conduction component 230. When complementary device 252 is bonded to IC package module 201 as shown in FIG. 2 (e.g., using heating, compression, ultrasonic, and/or other bonding processes), the bonding component 232 of each bonding element 222c forms a physical bond with contact element 260c of complementary device 252, and the conduction component 230 and bonding component 232 of each bonding element 222c collectively define a conductive connection between contact element 212c of IC package device 202 and contact element 260c of complementary device 252. The multiple bonding elements 222c may provide redundant physical bonds and redundant electrical connections between contact element 212c and contact element 260c.

Bonding element array 220d includes a single bonding element 222d providing an electrical connection between contact element 212d of IC package device 202 and contact element 260d of complementary device 252. Bonding element 222d may be formed as a via-type or trench-type structure in a via or trench opening in the bonding system substrate 223. Bonding element 222d may be larger (e.g., wider in the x-direction and/or z-direction) than individual bonding elements 222a-222c, to provide additional physical bonding and/or electrical connection as compared with individual bonding elements 222a-222c. Similar to bonding elements 222a-222c, bonding element 222d may include a conduction component 230 conductively connected to contact element 212d, and a bonding component 232 formed in a conduction component opening defined by the conduction component 230. When complementary device 252 is bonded to IC package module 201 as shown in FIG. 2 (e.g., using heating, compression, ultrasonic, and/or other bonding processes), the bonding component 232 of bonding element 222d forms a physical bond with contact element 260d of complementary device 252, and the conduction component 230 and bonding component 232 of bonding element 222d collectively define a conductive connection between contact element 212d of IC package device 202 and contact element 260d of complementary device 252.

As noted above, the bonding component 232 of each bonding element 222a-222d forms a physical bond with a respective contact element 260a-260d, and the conduction component 230 and bonding component 232 of each bonding element 222a-222d collectively define a conductive connection between a respective contact element 212a-212d and a corresponding contact element 260a-260d. In some examples, the physical bond formed by each bonding component 232 comprises a solder-type bond (e.g., a eutectic solder bond), or other thermocompressive bond, between the respective conduction component 230 and respective contact element 260a-260d.

In addition to the physical bond provided by each bonding component 232, each conduction component 230 may also form a physical bond, e.g., a thermocompression bond, with a respective contact element 260a-260d. In addition, upper surface areas of the bonding system substrate 223, e.g., SiON passivation region, may bond with opposing structures of each complementary device 250 and 252. For example, upper surface areas of the bonding system substrate 223, e.g., SiON passivation region, may form thermocompression bonds with opposing surfaces of contact element 260a-260d and/or other opposing surfaces (e.g., exposed surfaces of a passivation region) of each complementary device 250 and 252.

FIGS. 3A and 3B are side cross-sectional views showing an example IC package 300 including three IC package modules 301a, 301b, and 301c. In particular, FIG. 3A shows the IC package 300 during assembly, at a point after mounting IC package module 301b to IC package module 301a but prior to mounting IC package module 301c to IC package module 301a. FIG. 3B shows the IC package 300 after mounting both IC package modules 301b and 301c to IC package module 301a.

Each IC package module 301a, 301b, and 301c is generally similar to IC package module 201 discussed above.

IC package module 301a includes an IC package device 302a and a bonding system 304a for bonding IC package module 301a to IC package module 301b and IC package module 301c. IC package device 302a includes circuitry 310a including passive circuitry elements and/or active circuitry elements. Circuitry 310a includes two contact elements 312a and multiple contact elements 312a'. Bonding system 304a is formed on the IC package device 302a and includes two bonding element arrays 320a and multiple bonding element arrays 320a'. Each bonding element array 320a includes multiple bonding elements 322a connected to a respective contact element 312a, while each bonding element array 320a' includes a single bonding element 322 connected to a respective contact element 312a'. Similar to bonding elements 122 and 222 discussed above, each bonding element 322a is formed in a bonding system substrate 323a, e.g., SiON passivation region, and includes a conduction component 330 and a bonding component 332.

IC package module 301b includes an IC package device 302b and a bonding system 304b for bonding IC package module 301b to IC package module 301a. IC package device 302b includes circuitry 310b including passive circuitry elements and/or active circuitry elements. Circuitry 310b includes two contact elements 312b. Bonding system 304b is formed on the IC package device 302b and includes two bonding element arrays 320b, each including multiple bonding elements 322b connected to a respective contact element 312b. Each bonding element 322b is formed in a bonding system substrate 323b, e.g., SiON passivation region, and includes a conduction component 330 and a bonding component 332.

Each of the two bonding element arrays 320b provided in bonding system 304b is bonded to a corresponding bonding element array 320a provided in bonding system 304a, to thereby electrically connect each contact element 312b of IC package device 302b with a corresponding contact element 312a of IC package device 302a. As shown, the bonding component 332 of each bonding element 322b may form a physical bond with the bonding component 332 of a corresponding (opposing) bonding element 322a. Further, the conduction component 330 of each bonding element 322b may be bonded to, or held in contact with, the conduction component 330 of a corresponding (opposing) bonding element 322a, to thereby provide electrical connections between contact elements 312b and contact elements 312a.

As shown in FIG. 3A, a lateral spacing or "pitch" may be defined between adjacent bonding elements 322a in bonding element array 320a and similarly between adjacent bonding elements 322b in bonding element array 320b. The pitch may be selected based on a lateral alignment capability of a pick-and-place tool for aligning and mounting IC package module 301b onto IC package module 301a. For example, for a pick-and-place tool having a lateral alignment margin of +/−2 microns, bonding element arrays 320a and 320b may be formed with a pitch of at least 10 microns (i.e., at least five times the pick-and-place tool alignment margin), to provide effective bonding between respective bonding components 332 of bonding elements 322a and 322b for lateral alignment offsets within the lateral alignment margin of +/−2 microns.

IC package module 301c includes an IC package device 302c and a bonding system 304c for bonding IC package module 301c to IC package module 301a. IC package device 302c includes circuitry 310c including passive circuitry elements and/or active circuitry elements. Circuitry 310c includes multiple contact elements 312c. Bonding system 304c is formed on the IC package device 302c and includes multiple bonding element arrays 320c, each including a single bonding elements 322c connected to a respective contact element 312c. Each bonding element 322c is formed in a bonding system substrate 323c, e.g., SiON passivation region, and includes a conduction component 330 and a bonding component 332.

As shown in FIG. 3A, a pick-and-place tool may align IC package module 301c relative to IC package module 301a such that bonding elements 322c of bonding system 304c are aligned with corresponding bonding elements 322a of bonding system 304a. The pick-and-place tool may then place IC package module 301c into compressive contact with IC package module 301a, and a bonding process, e.g., a thermo-sonic compression bonding process including heating and application of ultrasonic energy, may be applied to form physical bonds between bonding elements 322c and corresponding bonding elements 322a. FIG. 3B shows IC package module 301c mounted and bonded to IC package module 301a using such process.

Figure 4A:
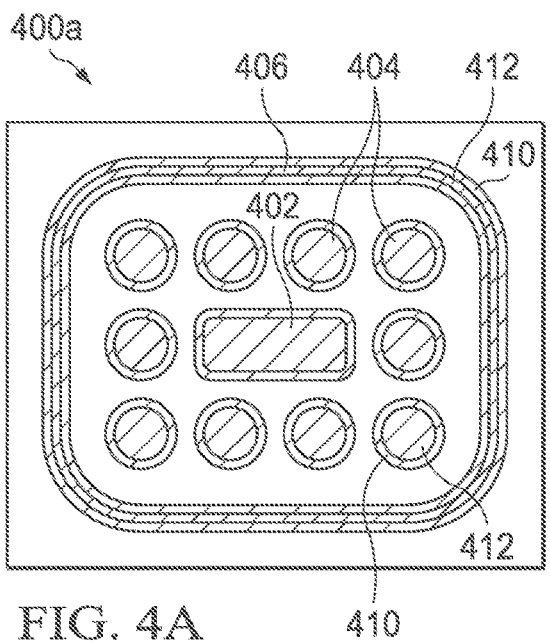
FIGS. 4A-4C illustrate cross-sectional top views of three example bonding element arrays.
Figure 4B:
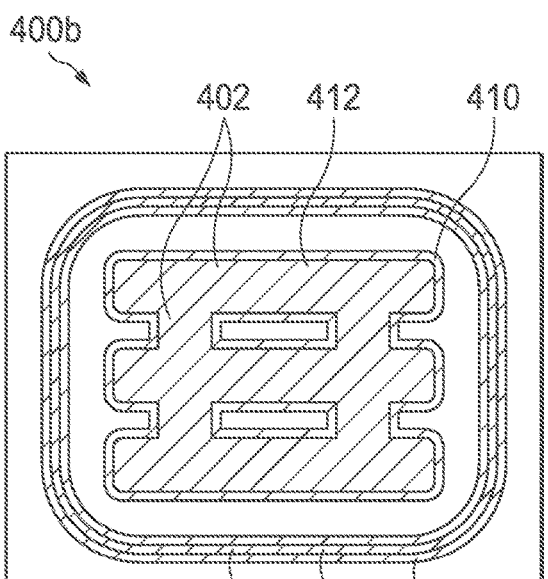
Figure 4C:
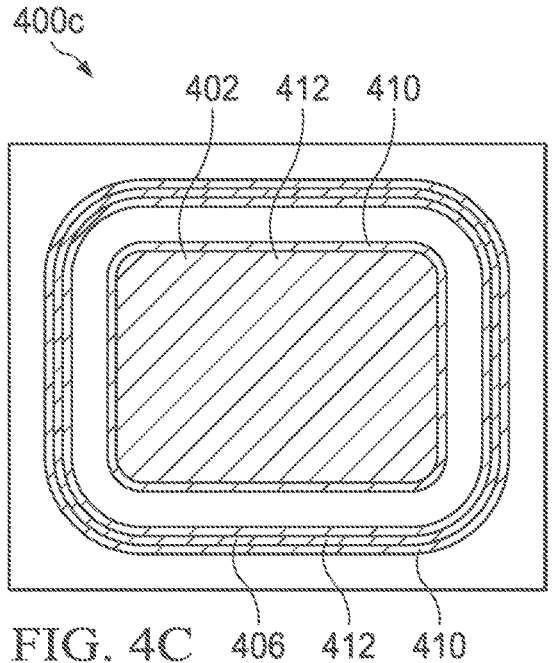

FIGS. 4A-4C illustrate cross-sectional top views of three example bonding element arrays, according to some examples. FIG. 4A shows a cross-section top view of an example bonding element array 400a including a trench-type bonding element 402 surrounded by ten via-type bonding elements 404, and a guard ring 406 surrounding the trench-type bonding element 402 and via-type bonding elements 404. The trench-type bonding element 402, each via-type bonding elements 404, and the guard ring 406 may each be formed with a conduction component 410 and a bonding component 412 formed in a conduction component opening defined by the respective conduction component 410. FIG. 4B shows a cross-section top view of an example bonding element array 400b including trench-type bonding elements 402 surrounded by a guard ring 406. The trench-type bonding elements 402 and guard ring 406 may each be formed with a conduction component 410 and a bonding component 412.

FIG. 4C shows a cross-sectional top view of an example bonding element array 400c including a single trench-type bonding element 402 surrounded by a guard ring 406, each of which includes a conduction component 410 and a bonding component 412.

Bonding elements arrays 400a-400c represent three examples only. In other examples, each bonding element array may include any number, combination, and arrangement of bonding elements formed as via-type elements, trench-type elements, guard rings, and/or type or types of bonding elements.

As shown in the examples discussed above, an IC package module may include a bonding system formed on a front side of an IC package module (e.g., a die, interposer, or combination thereof). In other examples, in addition to a bonding system formed on a front side of the IC package device, referred to herein as a front-side bonding system, an IC package module may include a back-side bonding system on a back side of the IC package device. The back-side bonding system may include one or more bonding elements formed as vias, referred to herein as "bonding through-vias," extending through the IC package device to a back side of the IC package module for bonding at least one complementary device to the back side of the IC package module. The bonding through-vias may have exposed surfaces at the back side of the IC package module for forming physical bonds with opposing structures of the at least one complementary device, and for providing electrical connection between the at least one complementary device and selected circuitry of the IC package device.

Figure 5:
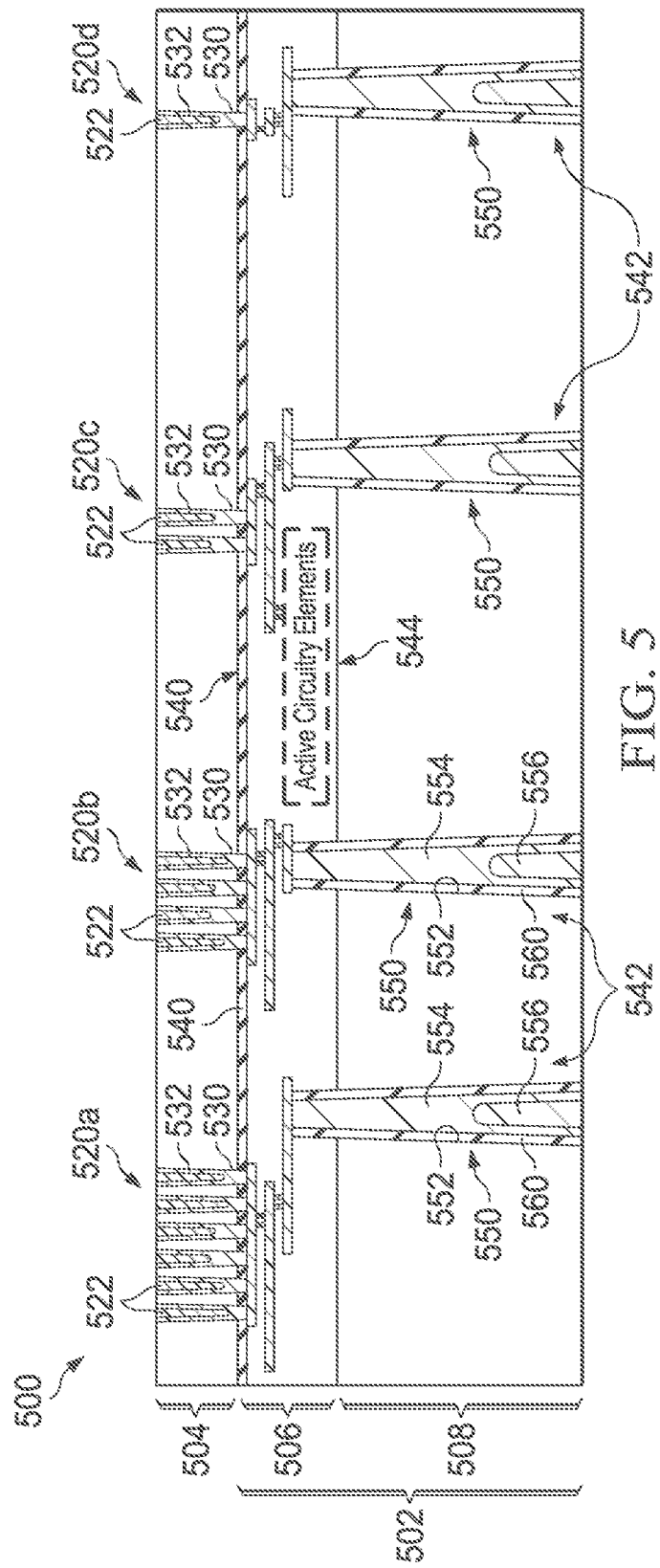
FIG. 5 shows an example IC package module including a front-side bonding system on a front side of the IC package module and back-side bonding through-vias on a back side of the IC package module.

FIG. 5 shows an example IC package module 500 including an IC package device 502, a front-side bonding system 504 formed on a front side 540 of the IC package device 502, and a back-side bonding system 542 formed on a back side 544 of the IC package device 502. The IC package device 502 may include a die (chip), interposer (e.g., a passive interposer or active interposer), or a combination of multiple device components. The example IC package device 502 shown in FIG. 5 comprises a system-on-a-chip (SoC) device including circuitry 506 (e.g., including passive interconnect circuitry and/or active circuitry elements) formed on an IC device substrate 508, e.g., a silicon substrate. In other examples, IC package device 502 may comprise circuitry 506 formed on a glass substrate 508.

As shown, the front-side bonding system 504 includes bonding element arrays 520a-520d coupled to respective contact elements 512a-512d. Each bonding element array 520a-520d includes one or bonding elements 522, each bonding element 522 including a conduction component 530 and a bonding component 532 formed in a conduction component opening of the conduction component 530, e.g., as described above with respect to the bonding elements shown in FIGS. 1-4C.

The back-side bonding system 542 includes a number of bonding through-vias 550 extending through IC device substrate 508 and electrically connected to circuitry 506. In some examples, bonding through-vias 550 may define through-silicon vias (TSVs) or through-glass vias (TGVs), e.g., depending on the composition of IC device substrate 508. Each bonding through-via 550 may be formed in a respective bonding through-via opening 552. Similar to bonding elements 522, each bonding through-via 550 may include a conduction component 554 and a bonding component 556 formed in a conduction component opening of the conduction component 554.

For each bonding through-via 550, the conduction component 554 may be formed from a first metal having a first melting point, while the bonding component 556 may be formed from a second metal having a second melting point lower than the first melting point of the first metal. For example, the first metal forming the conduction component 554 may comprise copper (Cu), silver (Ag), or gold (Au), while the second metal forming the bonding component 556 may comprise tin (Sn), indium (In), a tin alloy (e.g., tin alloyed with silver, indium, or other suitable metal), or an indium alloy (e.g., alloyed with silver, tin, or other suitable metal). In some examples, conduction components 554 and bonding components 556 of bonding through-vias 550 may be formed from the same or similar materials as conduction components 530 and bonding components 532, respectively, of bonding elements 522. In some examples, conduction components 554 and/or bonding components 556 of bonding through-vias 550 may be formed from different materials than conduction components 530 and/or bonding components 532, respectively, of bonding elements 522.

In examples in which IC device substrate 508 comprises silicon (i.e., wherein bonding through-vias 550 comprise TSVs), each bonding through-via 550 may be formed over a dielectric liner 560 formed in each bonding through-via opening 552 prior to forming the conduction components 554 and bonding components 556 of bonding through-vias 550. The dielectric liner 560 may comprise oxide, nitride, SiC, or other dielectric material, and may prevent or reduce contamination of the silicon substrate 508 caused by metal diffusion from the conduction component 554 (e.g., copper, silver, or gold), and/or prevent or reduce bridging (current leakage) between the conduction component 554 and surrounding silicon substrate 508. In other examples, e.g., where IC device substrate 508 comprises glass (i.e., wherein bonding through-vias 550 comprise TGVs), the dielectric liner 560 may be omitted.

In some examples, the back-side bonding system 542 including bonding through-vias 550 may be formed on the back side 544 of the IC package device 502 after forming the front-side bonding system 504 on the front side 540 of the IC package device 502, e.g., as discussed below with reference to FIGS. 10A-10F.

Figure 6:
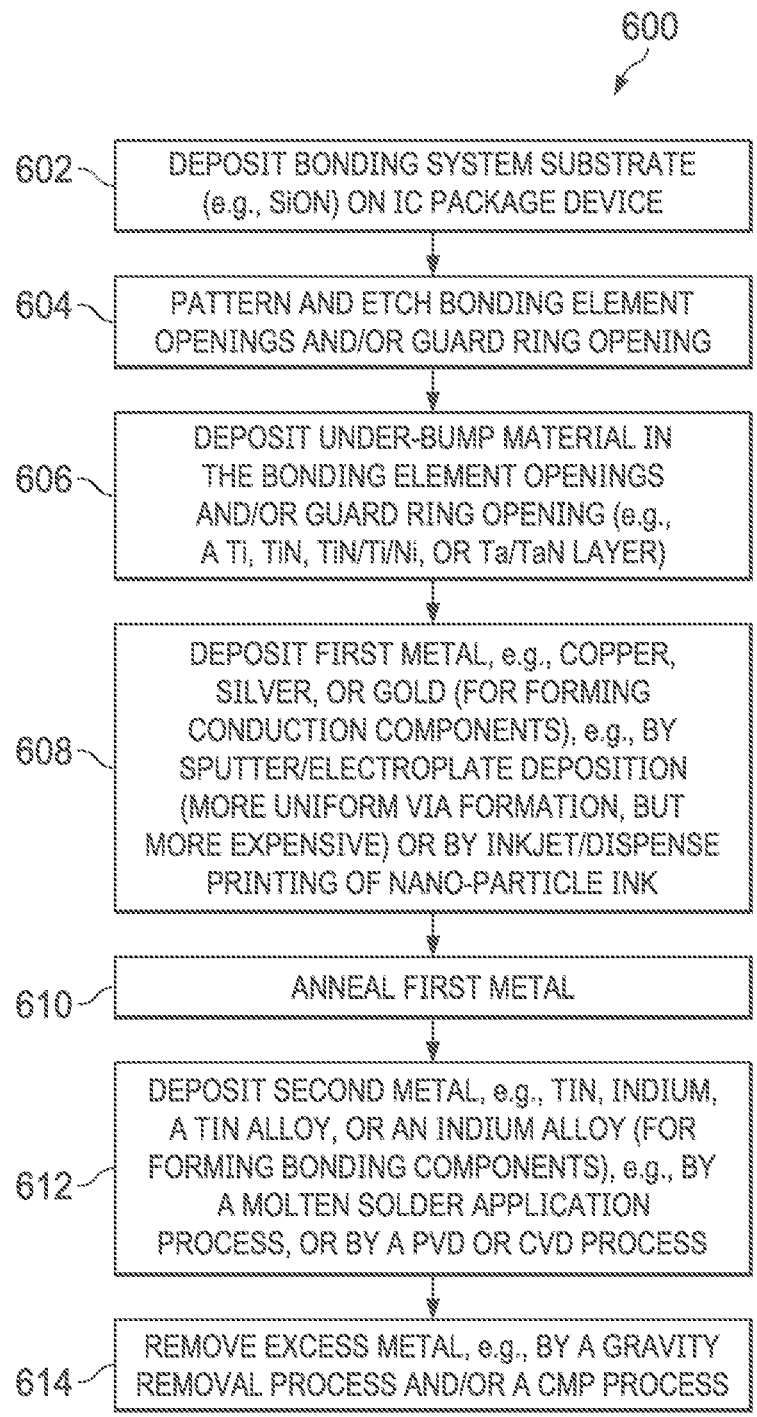
FIG. 6 is a flowchart of an example method for forming a bonding element array including multiple bonding elements, according to one example.

FIG. 6 is a flowchart of an example method 600 for forming a bonding element array including multiple bonding elements, according to one example. At 602, a bonding system substrate is deposited on an IC package device, e.g., an IC die or interposer. As noted above, in some examples the bonding system substrate comprises a silicon oxynitride (SiON) passivation region. SiON has particular characteristics suitable for use as a bonding system substrate. For example, SiON can be tuned for stress by varying the O and N ratio. In addition, SiON has a higher thermal conductivity than pure oxide, and acts as an effective barrier against metal ion diffusion. In addition, in some examples the outermost layer of the SiON region can be lightly oxidized to create a thin oxide layer (e.g., 5-10A thickness) for increased adhesion properties.

As 602, a photoresist layer is deposited on the bonding system substrate and patterned to form a photomask, and an etch is performed through the photomask to form multiple bonding element openings and (optionally) a guard ring opening in the bonding system substrate.

At 606, an optional under-bump liner (also referred to as a "glue layer") may be deposited in the bonding element openings and (optional) guard ring opening. In some examples, the under-bump liner comprises Ta or TaN, e.g., wherein the conduction component of the subsequently formed bonding elements comprises copper. In other embodiments, the under-bump liner comprises Ti, TiN, or a TiN/Ti/Ni layer stack, e.g., wherein the conduction component of the subsequently formed bonding elements comprises silver.

At 608, a first metal, which forms the conduction component of the bonding elements, is deposited on the under-bump liner in the bonding element openings and (optional) guard ring opening. As discussed above, in some examples the first metal may comprise copper, silver, or gold. The first metal may be deposited in any suitable manner. For example, the first metal may be deposited by sputtering, electroplating, an aerosol application processor, an inkjet printing process, or by a liquid suspension deposition process (e.g., using silver nanoparticle ink), atomic layer deposition (ALD), physical vapor deposition (PVD), or chemical vapor deposition (CVD).

At 610, an optional anneal may be performed, for example to reduce material stress in the first metal and/or to drive off solvent after an inkjet deposition or liquid suspension deposition (where the first metal is deposited by such processes).

At 612, a second metal, which forms the bonding component of the bonding elements, is deposited over the first metal in each bonding element opening and (optional) guard ring opening, in particular in a conduction component opening defined by the first metal in each bonding element opening and (optional) guard ring opening. In some examples, the second metal comprises tin (Sn), indium (In), a tin alloy (e.g., tin alloyed with silver, indium, or other suitable metal), or an indium alloy (e.g., alloyed with silver, tin, or other suitable metal). The second metal may be deposited in any suitable manner, for example by applying molten metal over the wafer and flowing down each conduction component opening, or by a PVD or CVD deposition process.

At 614, excess portions of the first metal and/or second metal may be removed, e.g., by a chemical mechanical planarization (CMP) process, or by a gravity-based removal process.

FIGS. 7A-7D are side cross-sectional views of a selected portion of an IC package module 700 showing an example process for forming a bonding element array 720 including multiple multi-component bonding elements 722 (and optionally at least one conduction-metal bonding element 722a) using an inject deposition process. As shown, the IC package module 700 includes (a) an IC package device 702 including circuitry 710 (e.g., metal interconnect circuitry) including a contact element 712 and (b) a bonding system 704 being constructed on the IC package device 702.

Figure 7A:
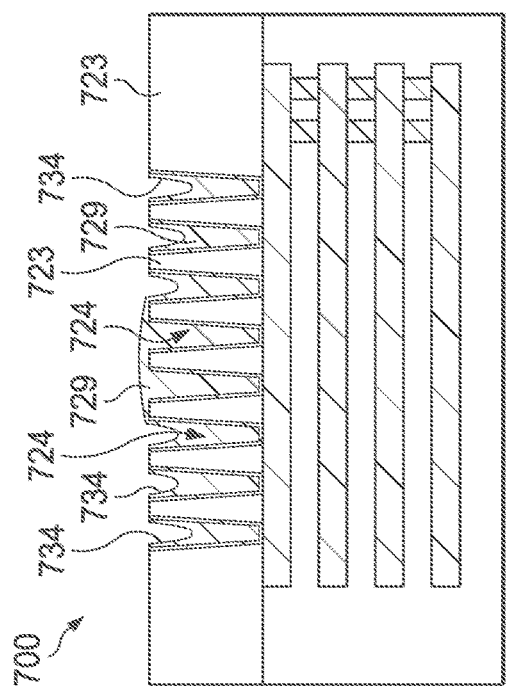
FIGS. 7A-7D are side cross-sectional views of an IC package module showing an example process for forming a bonding element array.

As shown in FIG. 7A, a bonding system substrate (e.g., SiON) 723 is formed on the IC package device 702, and an array of via-type bonding element openings 724 are formed in a bonding system substrate, e.g., using a photolithographic process. In some examples, an optional under-bump liner 725, e.g., comprising Ta, TaN, Ti, TiN, or TiN/Ti/Ni, is deposited in the via-type bonding element openings 724. In other examples, the optional under-bump liner 725 may be omitted.

Figure 7B:
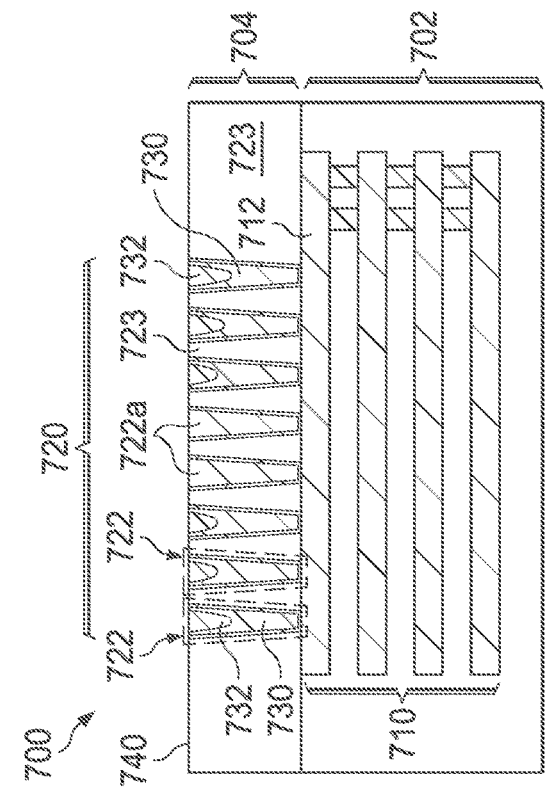

As shown in FIG. 7B, a first metal 729 in the form of a metal nanoparticle ink is deposited by an inkjet process. The metal nanoparticle ink 729 includes metal nanoparticles, e.g., silver nanoparticles, in a hydrophilic liquid ink suspension. The metal nanoparticle ink 729 may partially or fully fill each via-type bonding element opening 724 by capillary action. As shown, at least some of the bonding element openings 724 are only partially filled by the metal nanoparticle ink 729, with the unfilled portion of respective bonding element opening 724 defining a conduction component opening 734. An anneal process may then be performed to anneal the first metal (e.g., silver nanoparticles) to reduce material stress in the first metal and/or to drive off excess ink solvent.

Figure 7C:
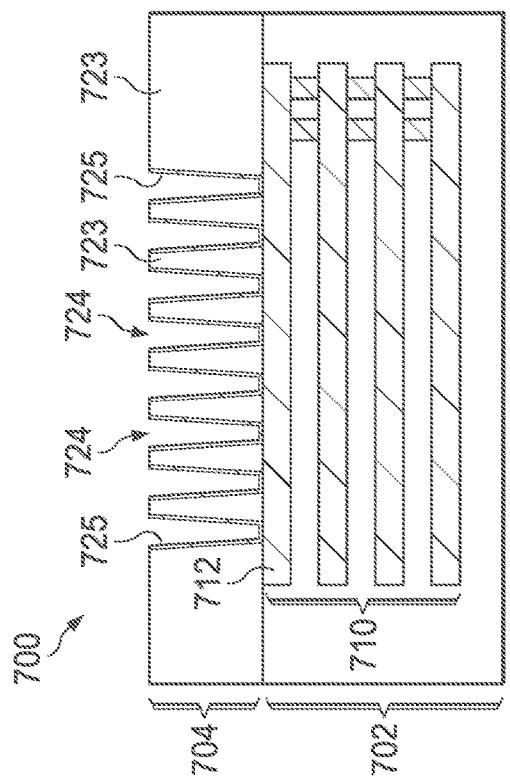

Next, as shown in FIG. 7C, a second metal 731 is deposited in the form of a molten metal over the bonding system substrate 723 and extending down into each conduction component opening 734. In some examples, the second metal comprises tin, indium, a tin alloy, or an indium alloy applied in molten form. The molten second metal 731 may react with the first metal 729 to form physical bonds, e.g., solder type bonds, between the two metals.

Figure 7D:
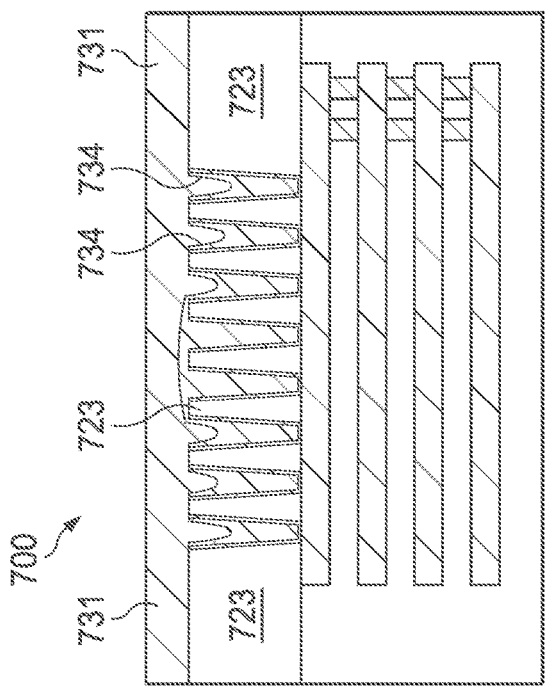

Next, as shown in FIG. 7D, a CMP process is performed to form a planarized top surface 740 of the bonding system 704 and remove excess portions of the first metal 729 and second metal 731. For each via-type bonding element opening 724 containing remaining portions of the first metal 729 and second metal 731, the remaining first metal 729 and second metal 731 defines the conduction component 730 and bonding component 732 of a respective multi-component bonding element 722.

In the example shown in FIG. 7D, at least one via-type bonding element opening 724 may be free of the second metal 731 after the CMP process. The first metal 729 in each such via-type bonding element opening 724 may define a conduction-metal-only bonding element 722a, which may be located for contacting a corresponding bonding element of a complementary device bonded to the example IC package module 700. In other examples, all via-type bonding element opening 724 may contain portions of both the first metal 729 and second metal 731 after the CMP process, such that the bonding element array 720 includes multi-component bonding elements 722 but no conduction-metal-only bonding elements 722a.

FIGS. 8A-8D are side cross-sectional views of a selected portion of an IC package module 800 showing an example process for forming a bonding element 822. As shown, the IC package module 800 includes (a) an IC package device 802 including circuitry 810 (e.g., metal interconnect circuitry) including a contact element 812 and (b) a bonding system 804 being constructed on the IC package device 802.

As shown in FIG. 8A, a bonding element opening 824, e.g., a via-type opening or a trench-type opening, is formed in a bonding system substrate 823 (e.g., comprising SiON), e.g., using a photolithographic process. In some examples, an optional under-bump liner 825, e.g., comprising Ta, TaN, Ti, TiN, or TiN/Ti/Ni, is deposited in the bonding element opening 824. In other examples, the optional under-bump liner 825 may be omitted.

A first metal 829 is then deposited by a sputter deposition process over the bonding system substrate 823 (and optional under-bump liner 825) and into the bonding element opening 824. In some examples, an electroplating process may also be performed to increase the thickness of the deposited first metal 829. The first metal 829 in the bonding element opening 824 defines a conduction component opening 834.

As shown in FIG. 8B, a second metal 831 is deposited by a physical vapor deposition (PVD) process over the first metal 829 and extending into the conduction component opening 834. In some examples, the second metal comprises tin, indium, a tin alloy, or an indium alloy. As shown in FIG. 8B, the deposited second metal 831 may include voids 850.

As shown in FIG. 8C, an anneal process is performed, e.g., to form or improve a bond between the second metal 831 and first metal 829 and/or to eliminate or reduce at least some voids 850 in the second metal 829. In some examples, the anneal process may comprise a rapid thermal process in a temperature range of 100-190° C. (e.g., using a set point of 180° C.).

Next, as shown in FIG. 8D, a CMP process is performed to form a planarized top surface 840 of the bonding system 804 and remove excess portions of the first metal 829 and second metal 831. The remaining portions of the first metal 829 and second metal 831 define a conduction component 830 and bonding component 832, respectively, of the bonding element 822.

FIGS. 9A-9D are side cross-sectional views of a selected portion of an IC package module 900 showing another example process for forming a bonding element 922. As shown, the IC package module 900 includes (a) an IC package device 902 including circuitry 910 (e.g., metal interconnect circuitry) including a contact element 912 and (b) a bonding system 904 being constructed on the IC package device 902.

Figure 9A:
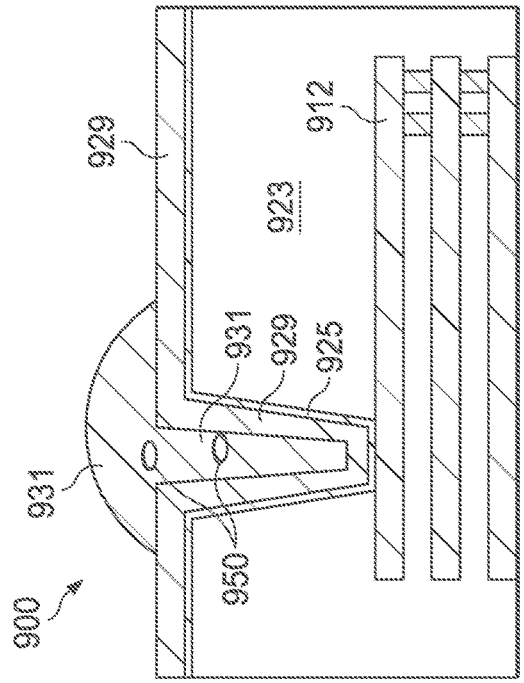
FIGS. 9A-9D are side cross-sectional views of an IC package module showing another example process for forming a bonding element.

As shown in FIG. 9A, a bonding element opening 924, e.g., a via-type opening or a trench-type opening, is formed in a bonding system substrate 923, e.g., using a photolithographic process. In some examples, an optional under-bump liner 925, e.g., comprising Ta, TaN, Ti, TiN, or TiN/Ti/Ni, is deposited in the bonding element opening 924. In other examples, the optional under-bump liner 925 may be omitted.

A first metal 929 is then deposited by a sputter deposition process over the bonding system substrate 923 (and optional under-bump liner 925) and into the bonding element opening 924. In some examples, an electroplating process may be performed to increase the thickness of the deposited first metal 929. The first metal 929 in the bonding element opening 924 defines a conduction component opening 934.

Figure 9B:
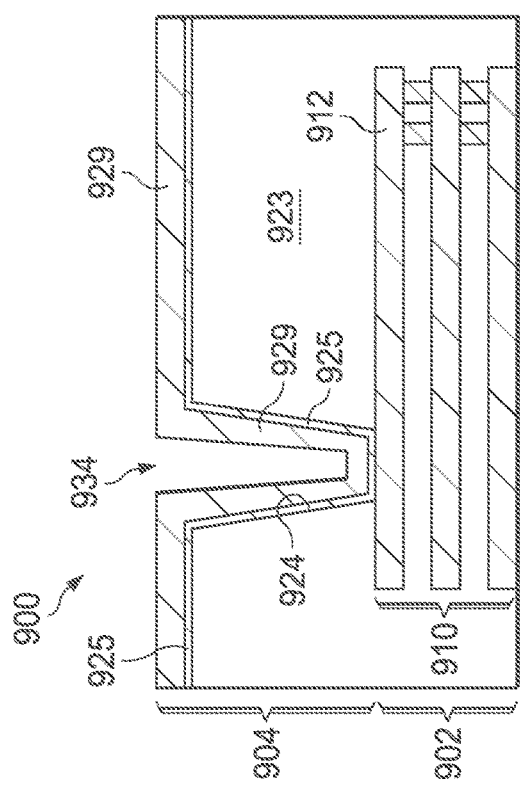

As shown in FIG. 9B, a second metal 931 is deposited by a liquid dispensing process over the first metal 929 and extending into the conduction component opening 934. In some examples, the second metal comprises tin, indium, a tin alloy, or an indium alloy applied in liquid or paste form. As shown in FIG. 9B, the deposited second metal 931 may include voids 950.

Figure 9C:
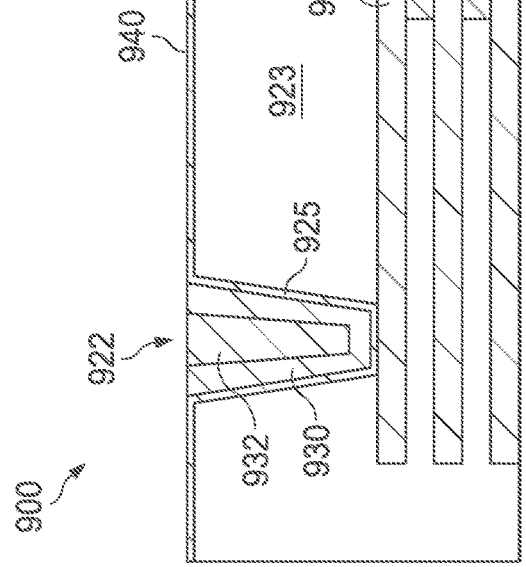

As shown in FIG. 9C, an anneal process is performed, e.g., to form or improve a bond between the second metal 931 and first metal 929 and/or to eliminate or reduce at least some voids 950 in the second metal 929. In some examples, the anneal process may comprise a rapid thermal process in a temperature range of 100-190° C. (e.g., using a set point of 190° C.).

Figure 9D:
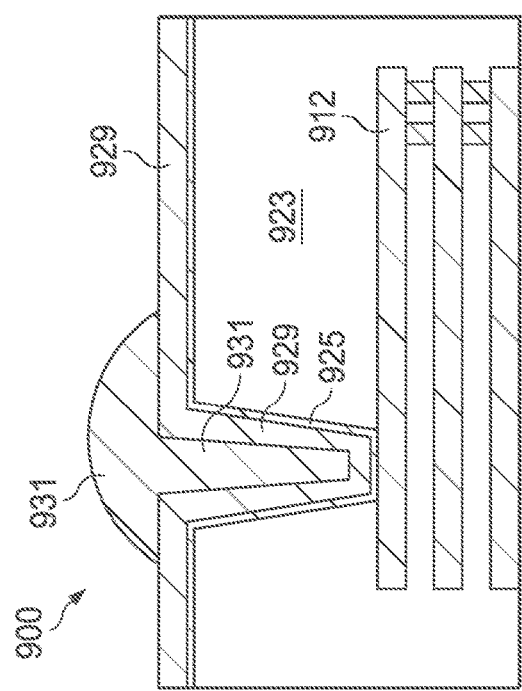

Next, as shown in FIG. 9D, a CMP process is performed to form a planarized top surface 940 of the bonding system 904 and remove excess portions of the first metal 929 and second metal 931. The remaining portions of the first metal 929 and second metal 931 define a conduction component 930 and bonding component 932, respectively, of the bonding element 922.

FIGS. 10A-10F are side cross-sectional views of a selected portion of an IC package module 1000 showing an example process for forming a bonding through-via 1050 of an example back-side bonding system 1044 at a back side 1040 of the IC package device 1002 for bonding at least one complementary device to the back side 1040 of the IC package device 1002. The example bonding through-via 1050 may correspond, for example, with bonding through-vias 550 shown in FIG. 5.

Figure 10A:
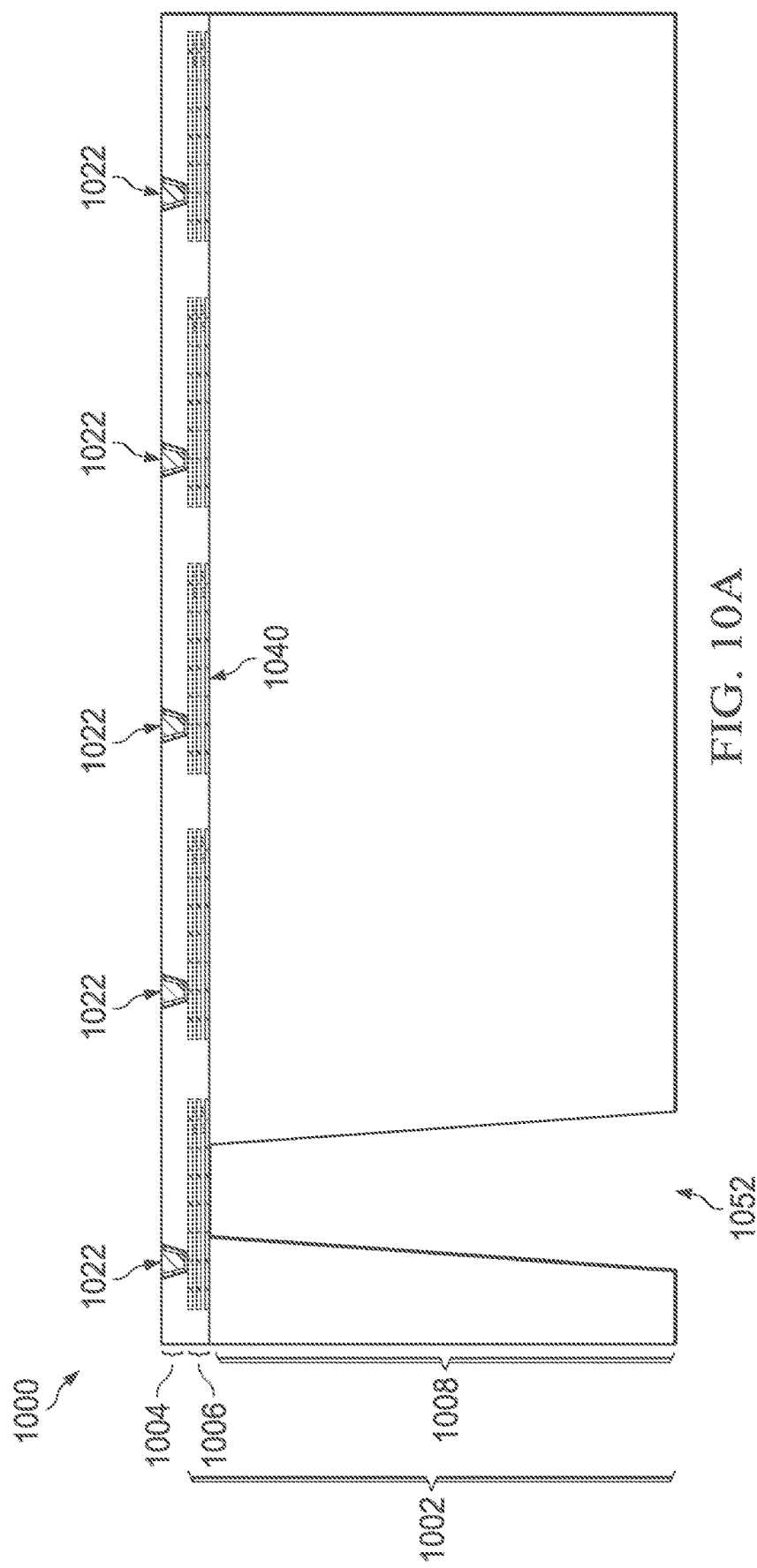

As shown, the IC package module 1000 includes a front-side bonding system 1004 formed on a front side of an IC package device 1002, and the back-side bonding system 1044 at the back side 1040 of the IC package device 1002. The IC package device 1002 may include a die (chip), interposer (e.g., a passive interposer or active interposer), or a combination of multiple device components. The example IC package device 1002 shown in FIGS. 10A-10F comprises a system-on-a-chip (SoC) device including circuitry 1006 (e.g., including passive interconnect circuitry and/or active circuitry elements) formed on a IC device substrate 1008, e.g., a silicon substrate. As shown in FIG. 10A, a through-via opening 1052 is patterned and etched at a back side of the IC device substrate 1008.

As shown in FIG. 10B, a through-via liner 1060, e.g., comprising silicon nitride (SiN), silicon carbide (SiC), or silicon dioxide ($SiO_2$) is deposited on the back side of the IC device substrate 1008 and extending into the through-via opening 1052.

Figure 10C:
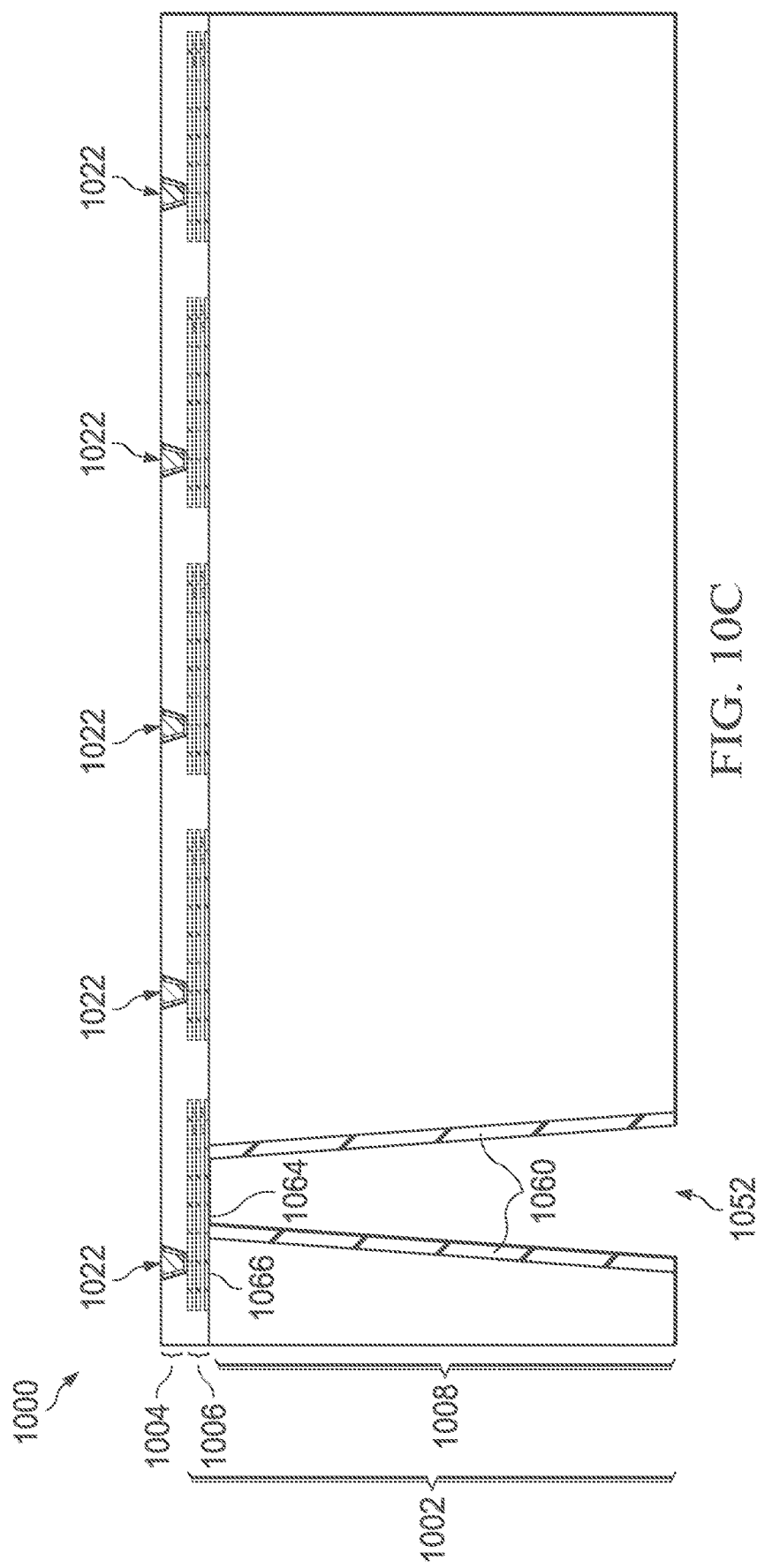

Next, as shown in FIG. 10C, an anisotropic etch is performed on the through-via liner 1060 to expose a back side surface 1064 of a contact element 1066 connected to circuitry 1006.

Figure 10D:
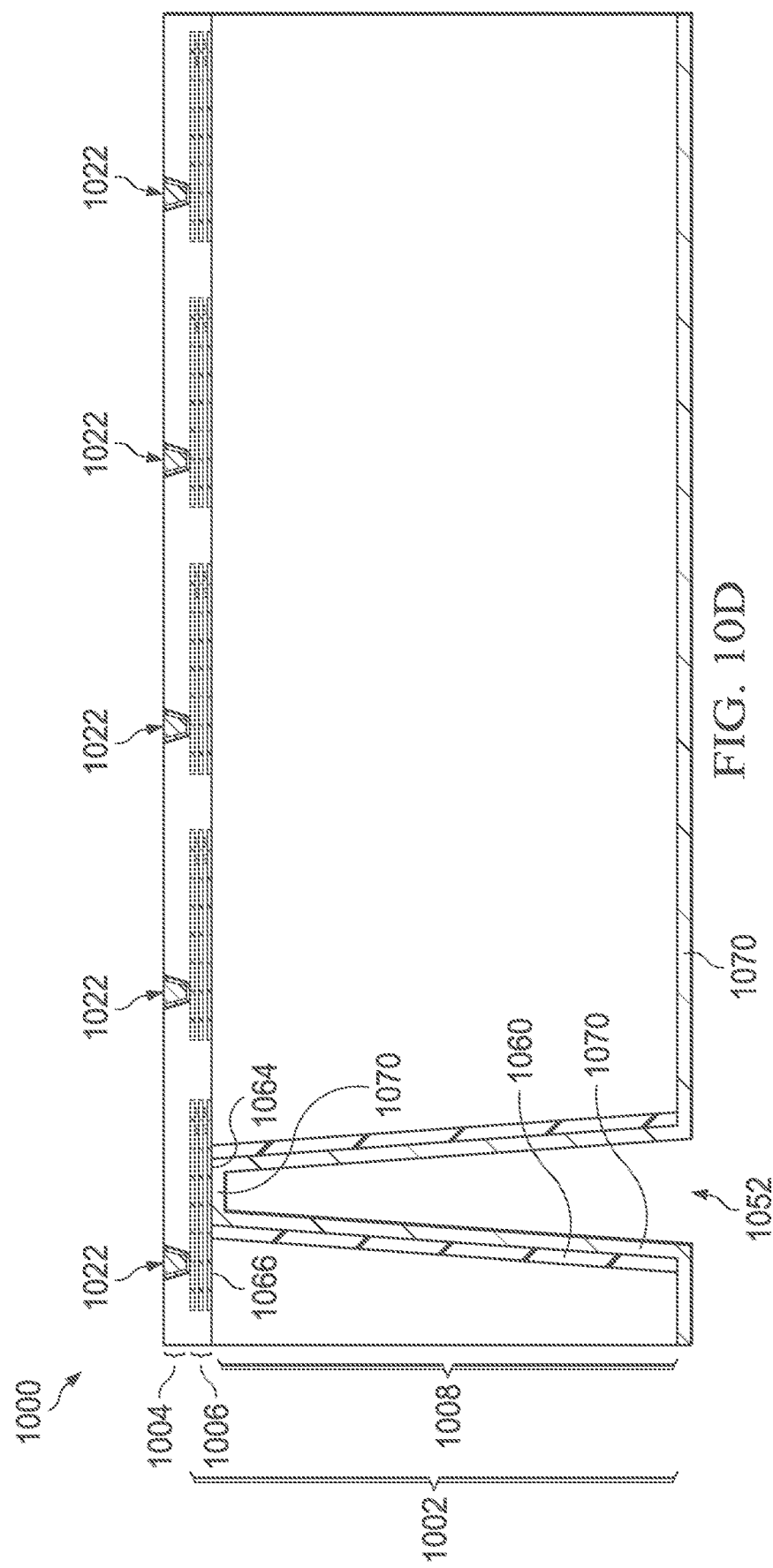

Next, as shown in FIG. 10D, a first metal 1070 is then deposited on the back side of the IC device substrate 1008 and extends into the through-via opening 1052 and is in contact with the back side surface 1064 of contact element 1066. In some examples, the first metal 1070 comprises copper, silver, or gold. The first metal 1070 may be deposited by a PVD processor or other suitable deposition process.

Figure 10E:
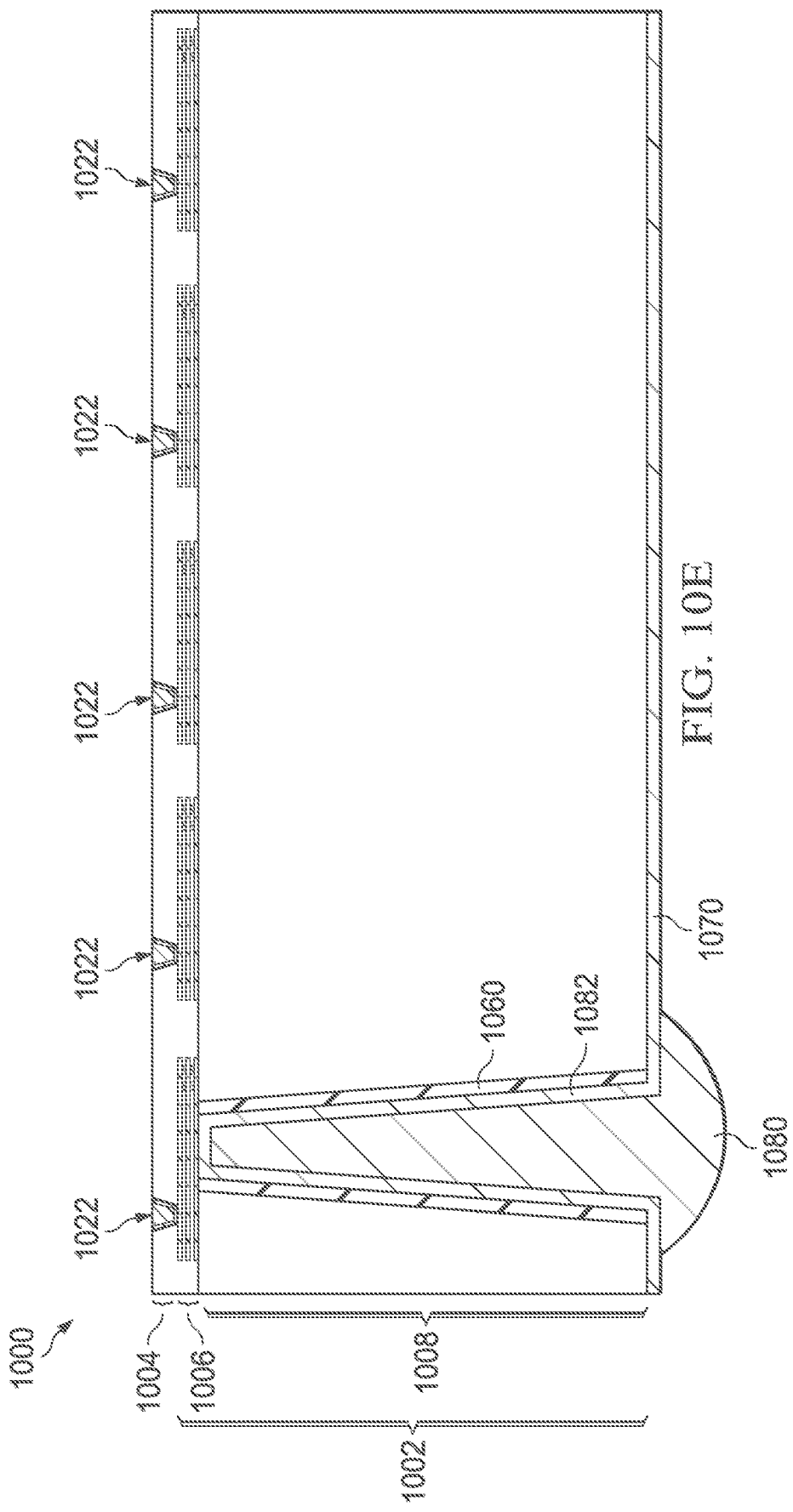

Next, as shown in FIG. 10E, a second metal 1080 is deposited by a liquid dispensing process over the first metal 1070 and extending into the through-via opening 1052. In some examples, the second metal 1080 comprises tin, indium, a tin alloy, or an indium alloy applied in liquid or paste form. An anneal process may be performed, e.g., to form or improve a bond between the second metal 1080 and first metal 1070.

Figure 10F:
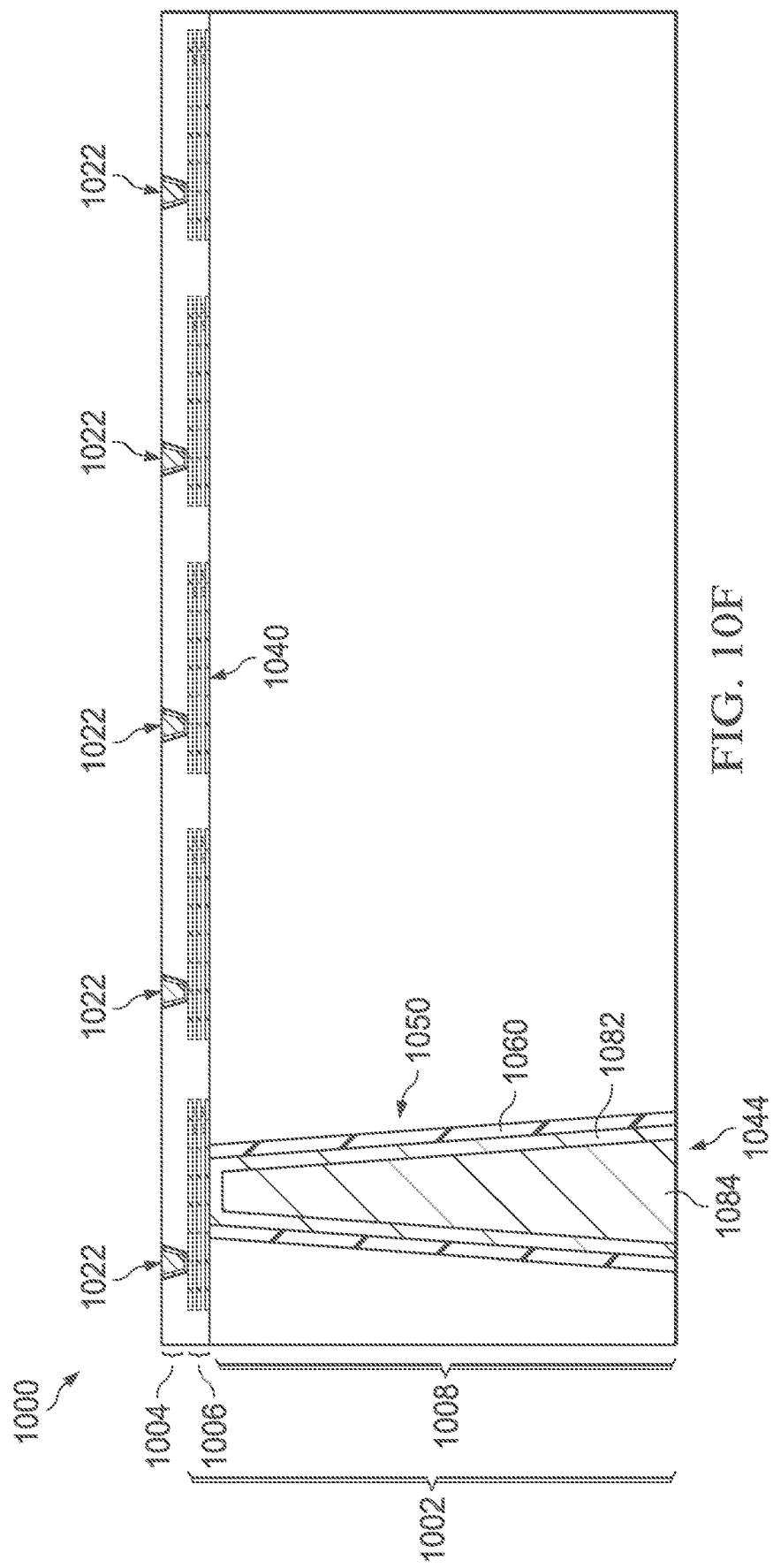

Next, as shown in FIG. 10F, a polishing process (e.g., CMP process) or back-side grind process is performed to form a planarized back side surface 1090 of the IC device substrate 1008 and remove excess portions of the first metal 1070 and second metal 1080. The remaining portions of the first metal 1070 and second metal 1080 define a conduction component 1082 and bonding component 1084, respectively, of the bonding through-via 1050.

The invention claimed is:

1. An integrated circuit package module, including:
   an integrated circuit package device including a contact element; and
   a bonding system formed on the integrated circuit package device, the bonding system including:
      a bonding system substrate; and
      a bonding element formed in the bonding system substrate and conductively coupled to the contact element of the integrated circuit package device, the bonding element comprising:
         a conduction component conductively connected to the contact element, the conduction component formed from a first metal having a first melting point; and
         a bonding component formed from a second metal having a second melting point, the second melting point lower than the first melting point.

2. The integrated circuit package module of claim 1, wherein:
   the first metal comprises copper, silver, or gold; and the second metal comprises tin, indium, a tin alloy, or an indium alloy.

3. The integrated circuit package module of claim 1, wherein the bonding system substrate comprises a passivation region.

4. The integrated circuit package module of claim 1, wherein the bonding component is formed in a conduction component opening defined by the conduction component.

5. The integrated circuit package module of claim 1, wherein an exposed surface of the bonding system opposite the integrated circuit package device includes an exposed surface of the conduction component and an exposed surface of the bonding component.

6. The integrated circuit package module of claim 1, wherein the bonding element is formed in a via opening.

7. The integrated circuit package module of claim 1, wherein the integrated circuit package device comprises an interposer.

8. The integrated circuit package module of claim 1, wherein the integrated circuit package device comprises an integrated circuit die.

9. The integrated circuit package module of claim 1, wherein:
the conduction component extends fully through a thickness of the bonding system substrate; and
the bonding component extends only partially through the thickness of the bonding system substrate.

10. The integrated circuit package module of claim 1, wherein the bonding system includes multiple bonding elements formed in the bonding system substrate and conductively coupled to the contact element;
wherein each bonding element of the multiple bonding elements includes:
a respective conduction component conductively connected to the contact element and formed from the first metal; and
a respective bonding component formed from the second metal.

11. The integrated circuit package module of claim 1, wherein:
the bonding system comprises a front-side bonding system formed on a front side of the integrated circuit package device; and
the integrated circuit package module further includes a back-side bonding system formed on a back side of the integrated circuit package device, wherein the back-side bonding system includes a back-side bonding element comprising:
a back-side bonding element conduction component formed from a first back-side bonding element metal having a first melting point; and
a back-side bonding element bonding component formed from a second back-side bonding element metal having a second melting point, the second melting point lower than the first melting point.

12. An integrated circuit package, comprising:
a first integrated circuit package module including:
a first integrated circuit package device including a first contact element; and
a bonding system formed on the integrated circuit package device, the bonding system including:
a bonding system substrate; and
a bonding element formed in the bonding system substrate, the bonding element comprising:
a conduction component conductively connected to the first contact element, the conduction component formed from a first metal having a first melting point; and
a bonding component formed from a second metal having a second melting point, the second melting point lower than the first melting point; and
a second integrated circuit package module bonded to the bonding system of the first integrated circuit package module such that the bonding system of the first integrated circuit package module is arranged between the second integrated circuit package module and the first integrated circuit package device of the first integrated circuit package module;
a bond between the bonding element and the second contact element of the second integrated circuit package module; and
an electrical connection between the bonding element and the second contact element of the second integrated circuit package module.

13. The integrated circuit package of claim 12, wherein the first integrated circuit package device comprises an interposer.

14. The integrated circuit package of claim 12, wherein the first integrated circuit package device comprises an integrated circuit die.

15. The integrated circuit package of claim 12, wherein:
the first metal comprises copper, silver, or gold; and
the second metal comprises tin, indium, a tin alloy, or an indium alloy.

16. The integrated circuit package of claim 12, wherein the bonding component is formed in a conduction component opening defined by the conduction component.

17. The integrated circuit package of claim 12, wherein the bond between the bonding element and the second contact element of the second integrated circuit package module includes a bond between the bonding component of the bonding element and second contact element of the second integrated circuit package module.

18. The integrated circuit package of claim 12, wherein the electrical connection between the bonding element and the second contact element of the second integrated circuit package module includes a conductive connection between the conduction component of the bonding element and second contact element of the second integrated circuit package module.

19. The integrated circuit package of claim 12, wherein the electrical connection between the bonding element and the second contact element of the second integrated circuit package module includes a conductive connection between the conduction component of the bonding element and second contact element of the second integrated circuit package module via the bonding component of the bonding element.

20. An integrated circuit package, comprising:
a first integrated circuit package module, including:
a first integrated circuit package device including a first contact element; and
a first bonding system formed on the first integrated circuit package device, the first bonding system including:
a first bonding system substrate; and
a first bonding element formed in the first bonding system substrate, the first bonding element comprising:
a first conduction component conductively connected to the first contact element, the first conduction component formed from a first metal having a first melting point; and a first bonding component formed from a second metal, the second metal having a melting point lower than the first melting point; and a second integrated circuit package module, including:

a second integrated circuit package device including a second contact element; and a second bonding system formed on the second integrated circuit package device, the second bonding system including:

a second bonding system substrate; and a second bonding element formed in the second bonding system substrate, the second bonding element comprising:

a second conduction component conductively connected to the second contact element, the second conduction component formed from a third metal; and a second bonding component formed from a fourth metal;

wherein the first bonding component of the first bonding element is bonded to the second bonding component of the second bonding element to form a bond between the first bonding system and the second bonding system; and wherein the first conduction component of the first bonding element is conductively connected to the second conduction component of the second bonding element to define a conductive connection between the first contact element of the first integrated circuit package device and the second contact element of the second integrated circuit package device.

21. The integrated circuit package of claim 20, wherein at least one of the first integrated circuit package device and second integrated circuit package device comprises an interposer.

22. The integrated circuit package of claim 20, wherein at least one of the first integrated circuit package device and second integrated circuit package device comprises an integrated circuit die.

23. The integrated circuit package of claim 20, wherein the third metal is the same as the first metal, and the fourth metal is the same as the second metal.

24. The integrated circuit package of claim 20, wherein:
each of the first metal and the third comprises copper, silver, or gold; and
each of the second metal and the fourth metal comprises tin, indium, a tin alloy, or an indium alloy.

25. The integrated circuit package of claim 20, wherein:
the first bonding component is formed in a conduction component opening defined in the first conduction component; and
the second bonding component is formed in a conduction component opening defined in the second conduction component.

26. The integrated circuit package module of claim 20, wherein:
the first conduction component extends fully through a thickness of the first bonding system substrate;
the first bonding component extends only partially through the thickness of the first bonding system substrate;
the second conduction component extends fully through a thickness of the second bonding system substrate; and
the second bonding component extends only partially through the thickness of the second bonding system substrate.

* * * * *